United States Patent
Iwase et al.

(10) Patent No.: US 6,992,926 B2
(45) Date of Patent: Jan. 31, 2006

(54) DRIVER CIRCUIT FOR SEMICONDUCTOR STORAGE DEVICE AND PORTABLE ELECTRONIC APPARATUS

(75) Inventors: Yasuaki Iwase, Tenri (JP); Yoshifumi Yaoi, Yamatokoriyama (JP); Hiroshi Iwata, Ikoma-gun (JP); Akihide Shibata, Nara (JP); Yoshinao Morikawa, Ikoma (JP); Masaru Nawaki, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 51 days.

(21) Appl. No.: 10/848,605

(22) Filed: May 19, 2004

(65) Prior Publication Data

US 2005/0001262 A1 Jan. 6, 2005

(30) Foreign Application Priority Data

May 20, 2003 (JP) .................................... 2003-142638

(51) Int. Cl.
*G11C 16/06* (2006.01)

(52) U.S. Cl. .......................... 365/184.23; 365/185.05; 365/230.06

(58) Field of Classification Search ............ 365/185.23, 365/185.05, 230.06
See application file for complete search history.

(56) References Cited

U.S. PATENT DOCUMENTS 4,875,191 A 10/1989 Mulder et al.

FOREIGN PATENT DOCUMENTS

| JP | 5-81072 B2 | 11/1993 |
|----|-----------|---------|
| JP | 5-304277 A | 11/1993 |
| JP | 9-97849 A | 4/1997 |
| JP | 9-116119 A | 5/1997 |
| JP | 2001-156188 A | 6/2001 |
| JP | 2001-230332 A | 6/2001 |
| WO | WO 99/07000 A | 2/1999 |
| WO | WO 01/17030 A1 | 3/2001 |
| WO | WO 03/044868 A1 | 5/2003 |
| WO | WO 03/075358 A1 | 9/2003 |
| WO | WO 03/075359 A1 | 9/2003 |
| WO | WO 03/103058 A1 | 12/2003 |
| WO | WO 2004/034474 A1 | 4/2004 |

*Primary Examiner*—Son T. Dinh
(74) *Attorney, Agent, or Firm*—Birch Stewart Kolasch & Birch LLP

(57) ABSTRACT

A semiconductor storage device is provided with a gate electrode, a semiconductor layer, a gate insulating film sandwiched between the gate electrode and the semiconductor layer, a channel region under the gate electrode, diffusion regions provided respectively on two sides of the channel regions and being of the other conductivity region than the channel region, memory elements 1 provided respectively on two sides of the gate electrode and having a function of holding charges, and a word line driver circuit, in which the CMOS technique is used. The driver circuit includes a common node for supplying a potential for activating an output inverter for driving a row word line. While the semiconductor storage device is in a read mode, a CMOS inverter other than the output inverter controls a signal at the common node, the CMOS inverter connected to a read input line. While the semiconductor storage device is in writing/erasing mode, a plurality of writing/erasing transistors connected in series to the node are activated in accordance with an address signal, in order to lower the common node to a low potential.

12 Claims, 17 Drawing Sheets

DRIVER CIRCUIT FOR SEMICONDUCTOR STORAGE DEVICE AND PORTABLE ELECTRONIC APPARATUS

This Nonprovisional application claims priority under 35 U.S.C. § 119(a) on Patent Application No. 2003-142638 filed in Japan on May 20, 2003, the entire contents of which are hereby incorporated by reference.

FIELD OF THE INVENTION

The present invention relates to improvement in an existing memory device technology. More particularly, the present invention relates to a driver circuit for driving a memory array including a plurality of memory elements, each of memory elements having (i) a gate electrode formed on a semiconductor layer with a gate insulating film therebetween, (ii) a channel region provided under the gate electrode, (iii) diffusion regions respectively provided on two sides of the channel region, the diffusion regions being of the other type of conductivity type than the channel region, and (iv) channel functioning members respectively provided on two sides of gate electrodes and having a function of holding charges therein.

BACKGROUND OF THE INVENTION

Conventionally, a flash memory has been used as a nonvolatile memory.

In this flash memory, as shown in FIG. 25, a memory cell is constituted such that a semiconductor substrate 901 includes thereon, via a gate insulating film, a floating gate 902, an insulating film 907, and a word line (control gate) 903 in this order, and a source line 904 and a bit line 905 are formed on both sides of the floating gate 902. Around the memory cell, an element separation region 906 is formed (for example, Japanese Laid-Open Patent Application No. 304277/1993 (Tokukaihei 5-304277; published on Nov. 16, 1993).

The memory cell holds memory depending upon the amount of charges in the floating gate 902. A memory cell array which is an array of memory cells enables rewriting and read-out operations with respect to intended memory cells by applying a predetermined voltage to particularly selected word lines and bit lines.

Such a flash memory shows drain current (Id) to gate voltage (Vg) characteristics as shown in FIG. 26 with variation in the amount of charges in the floating gate. Increase in the amount of negative charges in the floating gate increases a threshold value, and an Id-Vg curve moves substantially parallel to the direction where Vg increases.

However, such a flash memory has the following problems: it is functionally necessary that the insulating film 907 be placed to isolate the floating gate 902 from the word line 903; and it is difficult to reduce the thickness of the gate insulating film to prevent leakage of charges from the floating gate 902. Therefore, it is difficult to realize the reduction in thickness of the insulating film 907 and the gate insulating film, preventing the realization of a finer memory cell.

SUMMARY OF THE INVENTION

The present invention provides a driver circuit for a semiconductor storage device that can be easily miniaturized, and a portable electronic apparatus provided with the semiconductor storage device and the driver circuit.

The present invention provides a driver circuit for a semiconductor storage device for use in an EPD (Erasable Programmable Device). The driver circuit for the semiconductor storage device is used for controlling a row address accessing operation in a device having a memory array. By combining a reading driver circuit and a writing/erasing circuit, it is possible to attain an associated circuit provided in a pitch constrained region of the device of a physically smaller size.

Here, the EPD is a switching memory, that is, a memory element provided with (i) a semiconductor layer, (ii) a gate electrode, (iii) a gate insulating film, (iv) a channel region, (v) diffusion regions, and (vi) memory functioning members, wherein the gate electrode is formed on the semiconductor layer with the gate insulating film therebetween, the channel region is provided under the gate electrode, the diffusion regions are respectively provided on two sides of the channel regions and have an opposite conductivity type than that of the channel region, and the memory functioning members are formed on the gate electrode and have a function of holding an electric charge.

A driver circuit of a semiconductor storage device of the present invention uses a CMOS circuit. Each word line in the driver circuit is connected to an output terminal of a first CMOS inverter (output inverter). A gate of the output inverter is connected to a node connected to a connection section of a second CMOS inverter. A gate of the second CMOS inverter is controlled in accordance with a read control signal during reading operation period. The reading control signal controls activation of the second inverter, whereas the second CMOS inverter activates a transistor corresponding to the output inverter.

In order to write or erase, the plurality of writing/erasing transistors are connected in series to the nodes that are pulled up to a high potential. When a selected row is addressed in order to write or erase the selected row, a current passes through the plurality of the writing/erasing transistors in accordance with the address signal, thereby pulling down the node to a low potential.

For a fuller understanding of the nature and advantages of the invention, reference should be made to the ensuing detailed description taken in conjunction with the accompanying drawings.

DESCRIPTION OF THE EMBODIMENTS

Figure 1:
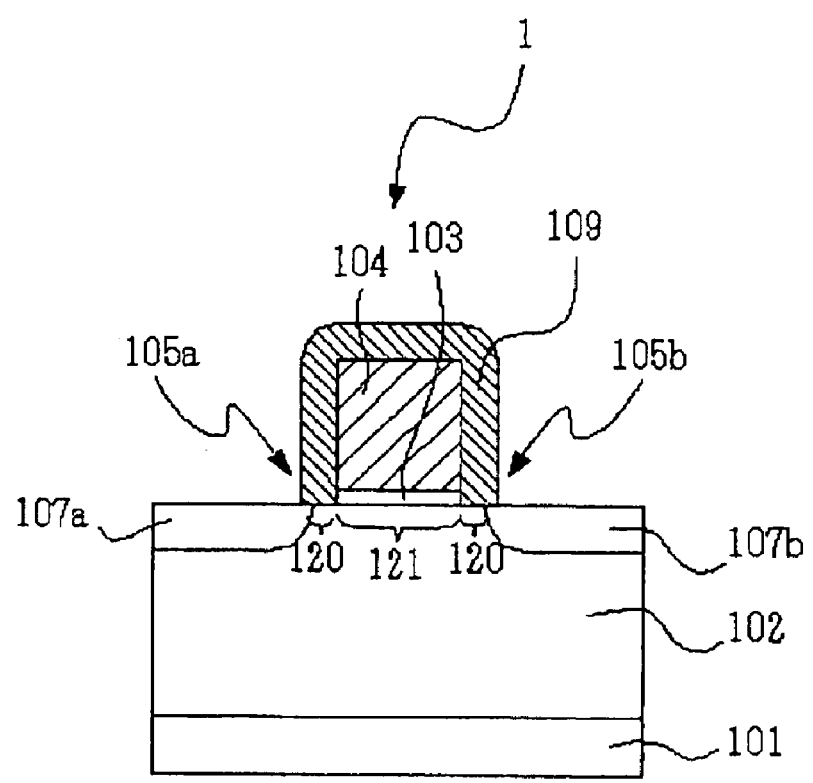
FIG. 1 is a cross-sectional diagram schematically showing a main part of a memory element in a semiconductor storage device of Embodiment 1 of the present invention.
Figure 2:
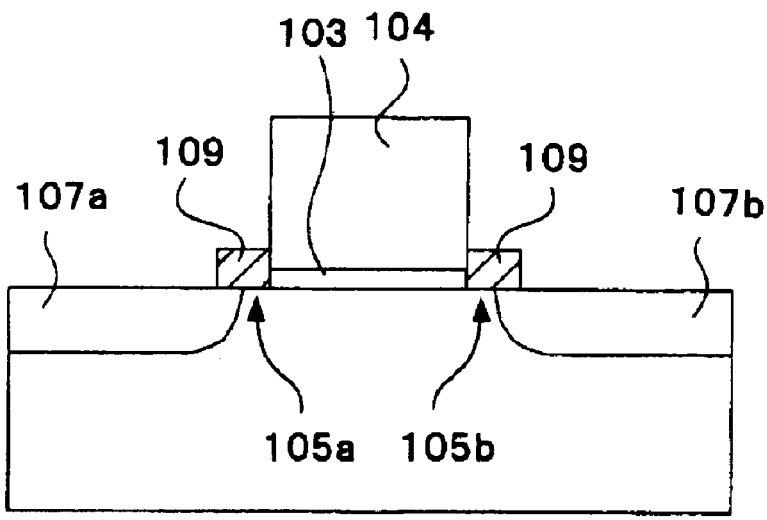
FIGS. 2(a) and 2(b) are cross-sectional diagrams each schematically showing a main part of a modified memory element in the semiconductor storage device of Embodiment 1 of the present invention.
Figure 2:
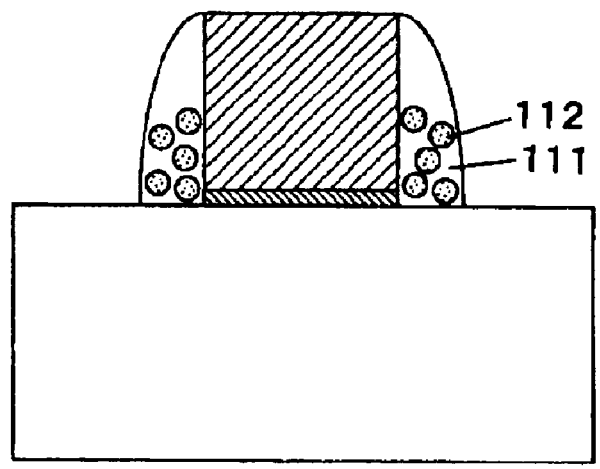

The following will describe one embodiment of the present invention with reference to FIGS. 1 to 24.

A semiconductor storage device of the present invention mainly includes a memory element and a control circuit for storing data in the memory element.

The memory element mainly includes a semiconductor layer, a gate insulating film, a gate electrode, a channel region, a diffusion region, and a memory functioning member. Here, the channel region, which is a conducting region of the same type as the semiconductor layer, means a region beneath the gate electrode. The diffusion region means a conducting region of the other type than the channel region.

Specifically, the memory element (device) of the present invention may be provided with a first conductive region (which acts as a diffusion region), a second conductive region (which acts as a channel region), a memory functioning member, a gate insulating film, and an electrode. The first conductive region is of a first conductivity type (either n- or p-type), and the second conductive region is of a second conductivity type, that is, of the other type (where the first conductive region is n-type, the second conductive region is p-type, and vice versa). The memory functioning member is provided over a boundary between the first and second conductive regions. The gate insulating film is provided between the memory functioning member and the electrode. However, it is appropriate that the memory element is so arranged as to include (i) a gate electrode provided on a gate insulating film, (ii) two memory functioning members provided on both sides of the gate electrode, (iii) and two diffusion regions provided such that the memory functioning members are respectively sandwiched between each diffusion region and the gate electrode, and (iv) a channel region provided under the gate electrode.

A semiconductor device of the present embodiment is preferably arranged such that the device is formed on a well region of the first conductivity type, the well region being formed on a semiconductor substrate or preferably in the semiconductor substrate, and acting as a semiconductor layer. The semiconductor substrate is not particularly limited, provided that the semiconductor substrate is applicable for a semiconductor device. For example, a bulk substrate made from an element semiconductor or a compound semiconductor may be used. Examples of the element semiconductor are silicon, germanium, and the like. Examples of the compound semiconductor are silicon germanium, GaAs, InGaAs, ZnSe, GaN, and the like. Moreover, the semiconductor substrate may be a substrate whose top layer is a semiconductor layer. Examples of this type of the substrate are: various substrates such as SOI (Silicon on Insulator) substrates, SOS substrate, multi-layer SOI substrate; and a substrate having a semiconductor layer on a substrate made of glass or plastic. Of those substrates, the silicon substrate, the SOI substrate (whose top layer is a silicon layer) and the like are preferable. The semiconductor substrate and the semiconductor layer may be monocrystal (for example, produced by epitaxial growth), polycrystal, or amorphous, even though an amount of current flowing therethrough varies depending on whether they are monocrystal, polycrystal, or amorphous.

It is preferable that an element separating region is provided on the semiconductor layer. By further including, in combination, an element (such as a transistor, a capacitor, and/or a resistor), a circuit formed by using the elements, a semiconductor device, and/or an interlayer-insulating film, the semiconductor layer may have a single-layer structure or a multi-layer structure. Note that the element separating region may be formed from an element separating film such as an LOCOS film, a trench oxide film, an SI film, and the like. The semiconductor layer may be either p-type conductive or n-type conductive. It is preferable that the semiconductor layer is provided with at least one well region of the first conductivity type (p-type or n-type). As the semiconductor layer and the well region, it is possible to use a semiconductor layer and the well region whose impurity concentration is within a range generally used in a field in which the semiconductor device is to be used. In case where the SOI substrate is used to provide the semiconductor layer, the semiconductor layer, which is a top layer and may be provided with a well region, may be provided with a body region under a channel region.

The gate insulating film is not particularly limited, provided that the gate insulating film is a gate insulating film generally used in a semiconductor device. For example, the gate insulating film may be an insulating film such as a silicon oxide film, a silicon nitride film, or the like; a single-layered high dielectric film or a laminate film including the high dielectric film (the high dielectric film may be an aluminum oxide film, titanium oxide film, a tantalum oxide film, a hafnium oxide film, or the like). Of those films, the silicon oxide film is preferable. The gate insulating film may have a thickness of, for example, about 1 nm to 20 nm, preferably of 1 nm to 6 nm. The gate insulating film may be provided only right under the gate electrode, or may have a size larger (a width wider) than the gate electrode.

The gate electrode is provided on the gate insulating film, and has a shape that is usually used in a semiconductor device, or a shape having a recess section in its bottom end portion. It is preferable that the gate electrode has an integrated shape without being separated by using a single-layered or a multi-layered conductive film. However, the gate electrode may be so arranged as to have a shape that is separated by using a single-layered or a multi-layered conductive film. Moreover, the gate electrode may be provided with a side-wall insulating film on its side. The gate electrode is not particularly limited, provided that the gate electrode is a gate electrode generally used in a semiconductor device. The gate electrode may be formed from a conductive film, which may be a single-layered or laminate film prepared from: polysilicon; a metal such as copper, aluminum, or the like; a metal having a high melting point, such as tungsten, titan, tantalum or the like; a silicide of the metal having the melting point; or the like. It is appropriate that the gate electrode has a thickness in a range of from 50 nm to 400 nm approximately, for example. Note that the channel region is formed under the gate electrode.

It is preferable that the gate electrode is provided only on a side wall of a memory functioning member later described, or is so provided as not to cover a top part of the memory functioning member. Those arrangements allow a contact plug to be provided in a vicinity of the gate electrode. Therefore, this arrangement makes it easier to attain a finer memory element. Moreover, the memory element having the simple arrangement as described above can be easily produced, thereby attaining a better yield.

The memory functioning member at least has a function to hold electric charges (hereinafter, this function is referred to as charge-holding function). In other words, the memory functioning member is configured (i) to accumulate and hold electric charges (charges), (ii) to trap electric charges, or (iii) to stay under an electric charge-polarized condition. The charge-holding function is attained in the memory functioning member, by providing the memory functioning member with a film or a region, which has a function to hold electric charges. Examples of materials to give the charge-holding function are: silicon nitride; silicon; silicate glass containing impurity such as phosphorus, boron, and/or the like; silicon carbide; alumina; high dielectric materials such as hafnium oxide, zirconium oxide, tantalum oxide, and the like; zinc oxide; ferroelectric substances; metals; and the like. Therefore, the memory functioning member may have a single-layered or laminated structure formed from, for example, (i) an insulating film including the silicon nitride film, (ii) an insulating film including a conductive layer or a semiconductor layer; an insulating layer including at least one dot made of a conductive material or a semiconductor material; an insulating film including a ferroelectric film in which polarization of electric charge is caused by applying an electric field and then is maintained; and the like film. Of those films, the silicon nitride film is preferable. The reasons why the silicon nitride film is preferable are as follows: a large hysteresis property can be attained because the silicon nitride film has a large number of levels for trapping electric charges; a good holding property can be attained by the silicon nitride film because the silicon nitride film holds the electric charge for a long time thereby preventing leak path, which causes electric charge leakage; and the silicon nitride film is a raw material used as standard.

With the arrangement in which the memory functioning member is provided with the film (such as the silicon nitride film or the like) having the charge-holding function, it is possible to attain more reliable memory holding function. Because the silicon nitride film is an insulator, electric charge leakage in part of the silicon nitride film will not lead to immediate loss of electric charge from the whole silicon nitride film. Moreover, in case where a plurality of memory elements (devices) are arrayed, this arrangement prevents erasure of data stored in a memory functioning member that touches an adjacent memory functioning member when the memory elements (devices) get closer to each other, in contrary to an arrangement in which the memory functioning members are conductive. Further, this arrangement enables a configuration of the contact plug and the memory functioning member to be compact with tight spacing. In some cases, this arrangement allows the contact plug to overlap with the memory functioning member. Thus, this arrangement makes it easier to attain a finer memory element.

Note that the film having the charge-holding function is not necessarily in a film-like shape. Even if the film having the charge-holding function is not in the film-like shape, more reliable memory holding can be attained. It is preferable that pieces of the film having the charge-holding function are dispersed (scattered) inside the insulating film. Specifically, it is preferable that the pieces of the film having the charge-holding function are scattered in a material having low electric charges capacity, for example, in silicon oxide, and in such a manner that the pieces are scattered in the material as scattered dots.

In the case where a conductive film or a semiconductor layer is used as the film having the charge-holding function (charge holding film), it is preferable that the charge holding film is so provided that (i) the charge holding film and (ii) the semiconductor layer (semiconductor substrate, well region, body region, source region, drain region, or diffusion region) or the gate electrode are separated by the insulating film provided therebetween, so that the charge holding film will not directly touch the semiconductor layer or the gate electrode. For example, this arrangement can be attained by (i) a laminate structure in which the conductive film is provided on the insulating film, (ii) a structure in which pieces of the conductive film are scatted, as dots scattered therein, in the insulating film, (iii) a structure in which a conductive film is provided in part of side-wall insulating film formed on a side wall of a gate, or (iv) the like structure.

The arrangement in which the insulating film including the conductive film or the semiconductor film is used as the memory functioning member is preferable, because this arrangement makes it possible to freely control an amount of electric charge entering a conductor or a semiconductor in the memory functioning member, thereby making it easier to attain multi-valued property. Furthermore, the arrangement in which the insulating film including at least one dot made of a conductive material or a semiconductor material is used as the memory functioning member is preferable, because this arrangement makes it easier to write and erase by direct tunneling of charges, thereby attaining lower power consumption.

Moreover, the memory functioning member may be a ferroelectric film whose polarization direction is changeable according to electric field. The ferroelectric film may be PZT (Lead Zirco-Titanate) family ferroelectric film, PLZT (Lead Zirco-Titanate) family ferroelectric film, or the like film. In this arrangement, polarization causes generation of charges substantially on a surface of the ferroelectric film. The charges thus generated are held. Therefore, it is possible to attain the hysteresis property that is similar to the hysteresis property attained by a film having a function to trap charges supplied from an outside of a film having a memory function. Furthermore, in order to hold the charges therein, the ferroelectric film needs no external supply of the charges in this arrangement. The ferroelectric film can attain the hysteresis property simply by polarization of the charges inside the film. Thus, fast writing (programming) and erasing can be realized by this arrangement. Therefore, this arrangement is preferable.

Note that an appropriate arrangement is one in which the insulating film included in the memory functioning member is a region from which the charges hardly leak out, or a film having a function of making it difficult for the charges to leak out. For example, a silicon oxide film or the like has the function of making it difficult for the charges to leak out.

The charge holding film to be included in the memory functioning member is provided directly on each side of the gate electrode. Alternatively, the charge holding film is provided indirectly on each side of the gate electrode with the insulating film sandwiched between the charge holding film and the gate electrode. Further, the charge holding film is provided on the gate insulating film (semiconductor substrate, well region, body region, source region, drain region or diffusion region) indirectly or directly, that is, with or without a gate insulating film sandwiched therebetween. It is preferable that the side walls of the gate electrode are partially or wholly covered with (i) the charge holding films provided directly thereon or (ii) the charge holding films provided indirectly thereon with the insulating film sandwiched between the charge holding film and the side wall of the gate electrode. As a specific example of usage, if the gate electrode has a recess section in its bottom end portion, the charge holding film may be formed such that the recess section is partially or completely filled with (i) the charge holding film provided directly on the gate electrode or (ii) the charge holding film provided indirectly on the gate electrode with the insulating film sandwiched between the charge holding film and the gate electrode.

The diffusion region may function as the source region and drain region, and has opposite conductivity to that of the semiconductor layer or the well region. It is preferable that impurity concentration changes steeply over the junction between the diffusion region and the conductive layer or the well region. This arrangement makes it possible to attain efficient generation of hot electrons or hot holes by using a low voltage, thereby attaining a high-speed operation by using a lower electrode. The diffusion region is not particularly limited in terms of depth of its junction. Thus, the depth of the junction of the diffusion region may be arbitrarily adjusted depending on properties and the like of the semiconductor storage device to be obtained. In case where the semiconductor substrate is an SOI substrate, the depth of the junction of the diffusion region may be shallower than a thickness of the top-layer semiconductor layer. However, it is preferable that the depth of the junction is approximately equivalent to the thickness of the top-layer semiconductor layer.

The diffusion regions may be provided so as to (i) overlap an end of a gate electrode, (ii) be located on the end of the gate electrode but not beyond the end of the gate electrode, or (iii) be offset with respect to the gate electrode terminal. Especially in the case where the diffusion region is offset with respect to the gate electrode terminal, an offset region under the charge holding film is reversed when a voltage is applied on the gate electrode. An amount of the charges accumulated in the memory functioning member largely changes how easily the offset region is reversed. Thus, in the case where the diffusion region is offset with respect to the gate electrode terminal, a higher memory effect and reduction in short-channel effect are attained. Therefore, it is preferable that the diffusion region is offset with respect to the gate electrode terminal. However, if the diffusion region is offset too much, a driving current across the diffusion region (between source and drain) becomes significantly small. Therefore, it is preferable that an offset amount (a distance in a gate length direction between one gate electrode terminal and the diffusion region that is closer to the gate electrode terminal) is shorter than a thickness of the charge holding film, the thickness being parallel to the gate length direction. It is especially important that at least part of the charge holding film (a film having the charge holding function) in the memory functioning member overlaps part of the diffusion region. This is important because the memory element constituting the semiconductor storage device performs its data rewriting operation by using an electric field across the memory functioning member, the electric field generated by voltage difference between the gate electrode and the diffusion region, the voltage difference existing only on the side wall of the memory functioning member.

The diffusion region may be arranged so that part of the diffusion region is located on a surface of the channel region, that is, in a position higher than a lower surface of the gate insulating film. In this arrangement, it is appropriate that a conductive film integrated with the diffusion region is provided on the diffusion region formed in the semiconductor substrate. The conductive film is, for example, made of (i) a semiconductor such as polysilicon, amorphous silicon, or the like, (ii) a silicide, (iii) any one of the above-mentioned metals and the metals having a high melting point, or (iv) the like. Of those materials, polysilicon is most preferable. Polysilicon has an a impurity diffusion rate much greater than that of the semiconductor layer. Because of this, the use of polysilicon makes it easier to attain the diffusion region whose junction has a shallower depth in the semiconductor layer. This makes it easier to suppress the short channel effect. Note that, in this arrangement, at least part of the memory functioning member is sandwiched between the gate electrode and the part of the diffusion region.

The memory element of the present embodiment may be formed via a semiconductor process generally used, for example by a method similar to a method of forming a single-layered or laminated structured side wall spacer on the side wall of the gate electrode. Specifically, the memory element may be formed by the following methods: (1) after forming the gate electrode, a single-layered film or a laminate film is formed including the film (hereinafter "charge holding film") having the function of holding the charge (the single-layered film or a laminate film may be a single layer of the charge holding film, a laminate film structured as the charge holding film/the insulating film, a laminate film structured as the insulating film/charge holding film, a laminate film structured as the insulating film/charge holding film/insulating film, and the like film). Then, the film is etched backed under an appropriate condition so that the film retains a side-wall-spacer-like shape; (2) one of the insulating film and the charge holding film is formed and then etched back under an appropriate condition so that the film retains the shape of the side wall spacer. Thereafter, the other one of the insulating film and the charge holding film is formed and then etched back similarly so that the film retains the side-wall-spacer-like shape; (3) An insulating film material in which particles of a charge holding material are dispersed is applied or deposited on the semiconductor layer including the gate electrode, thereby forming a film of the insulating material. The film is etched back under an appropriate condition so that the insulating film material retains the side-wall-spacer-like shape; (4) after forming the gate electrode, the single-layered film or the laminated film mentioned above is formed, and then subjected to patterning by using a mask; and (5) the like methods. Moreover, the memory element may be formed by the following method or the like method: before forming the gate electrode, formed is the charge holding film, the laminate film structured as charge holding film/insulating film, the laminate film structured as insulating film/charge holding film/insulating film, or the like film. And then, an aperture is formed in a region that is to be the channel region of the film. After that, the film of the gate electrode material is formed all over the aperture. Subsequently, the film of the gate electrode material is patterned in a shape that includes the aperture and is larger than the aperture.

A method of forming the memory element is explained below, referring to a memory element shown in FIG. 8. To begin with a gate insulating film 214 and a gate electrode 217 are formed on a semiconductor substrate 211 via a well-known process. Next, on a whole surface of the semiconductor substrate 211, a silicon oxide film 241 is formed by the thermal oxidation method or deposited by the CVD (Chemical Vapor Deposition) method. The silicon oxide film 241 has a thickness of 0.8 nm to 20 nm, preferably of 3 nm to 10 nm. Then, on a whole surface of the silicon oxide film 241, a silicon nitride film 242 is deposited by the CVD method, the silicon nitride film 242 having a thickness of 2 nm to 15 nm, preferably of 3 nm to 10 nm. Further, on a whole surface of the silicon nitride film, a silicon oxide film 243 having a thickness in a range of 20 nm to 70 nm is formed by the CVD method. In this way, a laminate of silicon oxide film/silicon nitride film/silicon oxide film is formed.

Next, the laminate of silicon oxide film/silicon nitride film/silicon oxide film is etched back by anisotropic etching. Thereby, memory functioning members 261 and 262 having the side-wall-spacer-like shape are formed on the gate electrode 217. The thus formed memory functioning members 261 and 262 are suitable for recording operation.

After that, diffusion regions (source/drain regions) 212 and 213 are formed by ion introduction during which the gate electrode 217 and the memory functioning members 261 and 262 having the side-wall-spacer-like shape are used as masks. After the formation of the diffusion regions 212 and 213, the silicide process and the process of forming upper wiring are performed via the well known process.

In case where a memory cell array is formed by arraying the memory elements (devices) of the present embodiment, a best arrangement of the memory element (devices) satisfy all of the followings requirements, for example: (1) gate electrodes of a plurality of memory elements (devices) are connected together and function as a word line; (2) memory functioning members are provided respectively on both sides of the word line; (3) an insulator, especially a silicon nitride film has a function of holding charges in each memory functioning member; (4) the memory functioning members are formed from ONO (Oxide Nitride Oxide) films, and the silicon nitride film has a surface that is substantially parallel to a surface of the gate insulating film; (5) the silicon nitride film inside the memory functioning member is separated from the word line and a channel region by a silicon oxide film; (6) the silicon nitride film inside the memory functioning member overlaps a diffusion region; (7) the insulating film and the gate insulating film are different in thickness, the insulating film separating, from the channel region or a semiconductor layer, the silicon nitride film having the surface that is substantially parallel to the surface of the gate insulting film; (8) writing and erasing operations of a memory element is carried out by a word line; (9) no electrode (word line) having a function of assisting the writing and erasing operations is provided on the memory functioning member; and (10) areas right under the memory functioning members and adjacent to the diffusion region respectively have high concentrations of impurity that is of the opposite conductivity type than the conductivity type of the diffusion region. The memory element (devices) is, however, only required to satisfy at least one of the requirements.

An especially preferable combination of the requirements is, for example, a combination of (3) the insulating body, especially the silicon nitride film has the function of holding charges in each memory functioning member; (6) the silicon nitride film inside the memory functioning member overlaps on the diffusion region; and (9) no electrode (word line) having the function of assisting the writing and erasing operations is provided on the memory functioning member.

The combination of the requirements (3) and (9) is very advantageous as descried below.

To begin with, it is possible to arrange such that a bit line contact is provided closer to the memory functioning member provided on a side of the word line. Thus, data stored in memory functioning members can be maintained because the memory functioning members do not touch each other even when the memory elements (devices) get closer to each other. Therefore, the combination of the requirements (3) and (9) makes it easier to attain a finer memory element (devices). Note that in case where charge holding regions in the memory functioning member are made of a conductor, the charge holding regions interfere with each other as the memory elements (devices) get closer to each other due to capacitor coupling. As a result, the data stored in the memory functioning member cannot be maintained.

Moreover, in case where the charge holding region in the memory functioning member is an insulator (for example, the silicon nitride film), there is no need of separating a memory functioning member per memory cell. For example, memory functioning members provided on both sides of the one word line and shared between/among a plurality of memory cells need not be parted for each memory cell, and may be shared between/among the plurality of memory cells sharing the word line. Because of this, there is no need of photo-etching process that is for parting the memory functioning member. Therefore, it is possible to attain a simpler manufacturing process. Furthermore, there is no need of allowing margins for positioning in the photolithography process and for film loss caused by the etching. Therefore, it is possible to arrange the memory cells to have a smaller margin between them. Thus, if the memory cells are microfabricated to the same extent, the arrangement in which the charge holding area is an insulator, requires a smaller occupying area for the memory cells, compared with the arrangement in which the charge holding area in the memory functioning member is a conductor (for example, a polycrystalline silicon film). Note that the arrangement in which the charge holding area in the memory functioning member is a conductor requires the photo-etching process for parting the memory functioning member per memory cell, thus requiring a margin for positioning during light-exposure and for film loss caused by the etching.

Furthermore, in the arrangement in which the charge holding area is an insulator, no electrode having a function of assisting the writing and erasing operations is provided on the memory functioning member, and thus this arrangement has a simpler structure as to its elements. On account of this, it is possible to produce the semiconductor storage device with a higher yield via production process having a less number of steps therein. Thus, it is possible to attain a semiconductor storage device in which the memory cell is easily mounted together with a transistor constituting a logic circuit or an analog circuit, and that has a low cost.

Moreover, more effective is the arrangement in which not only the requirements (3) and (9) but also the requirement (6) is satisfied. With the arrangement in which the charge holding region in the memory functioning member overlaps the diffusion region, it is possible to perform the writing and erasing operations by using a very low voltage. Specifically, it is possible to carry out the writing and erasing operations by using a voltage of 5V or less. This advantage is quite effective in designing circuits. Because it is unnecessary to generate a high voltage in this arrangement unlike a flash memory, it is possible to omit or scale down a charge-pumping circuit that requires a huge occupying area. Especially, in case where, in a logic LSI, a memory section of small capacity is provided, for adjustment, a periphery circuit for driving a memory cell dominates in an occupying area of the memory section, rather than the memory cell. Therefore, for attaining a smaller chip size, it is most effective to omit or scale down a voltage-boosting circuit used for the memory cell.

On the other hand, in case where the requirement (3) is not satisfied, that is, where in the memory functioning member a section for holding charges is a conductor, it is possible to carry out the writing operation, even if the requirement (6) is not satisfied, that is, even if the conductor in the memory functioning member does not overlap the diffusion region. This is because the writing operation is assisted by capacitor coupling between (i) the conductor in the memory functioning member and (ii) the gate electrode. Moreover, in case where the requirement (9) is not satisfied, that is, where an electrode having the function of assisting the writing and erasing operations is provided on the memory functioning member, it is possible to perform the writing operation, even if the requirement (6) is not satisfied, that is, even if the conductor in the memory functioning member does not overlap on the diffusion region.

In the present semiconductor storage device, one of or both of the memory elements (devices) may be connected with a transistor. Further, the memory elements (devices) may be mounted, on one chip, together with a logic transistor. In those arrangements, the semiconductor storage device, especially, the memory element can be produced in a step that is highly compatible with a formation process of a standard transistor such as the transistor, the logic transistor, or the like. Thus, it is possible to form (i) the semiconductor device, especially the memory element, and (ii) the transistor or the logic transistor, in the same step. Therefore, it is possible to employ a very simple process in order to mount, on one chip, (i) the memory element and (ii) the transistor or the logic transistor. Thus, it is possible to attain, at a low cost, a device on which (i) the memory element and (ii) the transistor or the logic transistor are mounted together.

The present semiconductor storage device is so arranged that the memory element is capable of storing data of binary or more in each memory functioning member, and the memory element thereby stores quaternary or more. Note that the memory element may store binary data. Moreover, the memory element may have a function as a memory cell that acts as both a selection transistor and a memory by utilizing variable resistance property of the memory functioning member.

The present semiconductor storage device, by being combined with a logic element or a logic circuit, can be used in electronic apparatuses as follows: (1) data processing systems for personal computers, notebook-type computers, laptop-type computers, personal digital assistants/personal communicators, minicomputers, work stations, mainframes, multiprocessor computers, any others types of computers, and the like; (2) electronic parts constituting data processing systems for CPUs, memories, data storage devices, and the like; (3) communication apparatuses such as telephones, PHSs (devices for the personal handy-phone system), modems, routers, and the like; (4) image display apparatuses such as display panels, projectors and the like; (5) offices machines such as printers, scanner, photocopying machines; (6) imaging apparatuses such as video cameras, digital cameras, and the like; (7) entertainment/amusement apparatuses such as game machines, music players, and the like; (8) information apparatuses such as portable information terminals, watches/clocks, electronic dictionaries, and the like; (9) apparatus for use in automobiles, such as car navigation system devices, car audio devices, and the like; (10) audiovisual apparatuses for recording/reproducing data for moving pictures, still pictures, music (sounds) and the like; (11) electric appliances such as washing machines, microwave ovens, refrigerators, rice cookers, dish washers, cleaners, air conditioners, and the like; (12) apparatuses for health care, such as massaging apparatuses, weighing machines, blood-pressure meters, and the like; (13) portable storage devices such as IC cards, memory cards and the like; (14) and the like. Especially, the present semiconductor storage device is effectively applicable in portable electronic apparatuses such as portable telephones, portable information terminals, IC cards, memory cards, portable computers, portable game machines, digital cameras, portable moving-picture players, portable music players, electronic dictionaries, watches, and the like. Note that the present semiconductor storage device may be built, as at least part of a control circuit or a data storage circuit, in the electronic apparatuses, or may be detachably provided to the electronic apparatuses.

[Embodiment 1]

A semiconductor storage device of the present embodiment includes a memory element 1 as shown in FIG. 1.

The memory element 1 is arranged such that a gate electrode 104 is formed via a gate insulating film 103 on a P-type well region 102 which is formed on the surface of a semiconductor substrate 101. On the upper surface and side surfaces of the gate electrode 104, arranged is a silicon nitride film 109 which is a charge holding film, holding charges at a trap level. The portions of the silicon nitride film 109 on the both side walls serve as memory functional sections 105a and 105b where charges are actually held. Here, the memory functional section indicates a section where charges are actually accumulated by rewriting operation in a memory functioning member or a charge holding film. In the P-type well region 102 on the opposite sides of the gate electrode 104, formed are N-type diffusion regions 107a and 107b which function as source region or drain region. The diffusion regions 107a and 107b have an offset structure. That is, neither the diffusion regions 107a nor 107b extend to an region 121 under the gate electrode 104, and offset regions 120 under the charge holding film constitutes a part of the channel region.

Note that, the memory functional sections 105a and 105b substantially holding charges are portions on the both side walls of the gate electrode 104. Therefore, only the regions corresponding to these portions should include the silicon nitride film 109 formed thereon (see FIG. 2(a)). The memory functional sections 105a and 105b may have a structure in which fine particles 111 each realized by a nanometer-size electric conductor or semiconductor are dispersed in an insulating film 112 (see FIG. 2(b)). In this structure, if the fine particles 111 have a diameter of less than 1 nm, large quantum effects are produced which makes it difficult for a charge to tunnel through a dot. However, if the fine particles 111 have a diameter of more than 10 nm significant quantum effects are not produced at room temperature. Therefore, it is preferable that the fine particle 111 is in the 1 nm to 10 nm diameter range. Moreover, the silicon nitride film 109, a charge holding film, may be formed in a sidewall-spacer manner on the side surfaces of the gate electrode (see FIG. 3).

A principle of the writing operation by a memory element will be described with reference to FIG. 3 and FIG. 4. Note that, the following description is given based on the case where both of first memory functioning member 131a and second memory functioning member 131b have functions of holding charges. Writing operation indicates an operation of injecting electrons into the memory functioning members 131a and 131b when the memory element is a N-channel type memory element. The following description assumes that the memory element is a N-channel type memory element.

Figure 3:
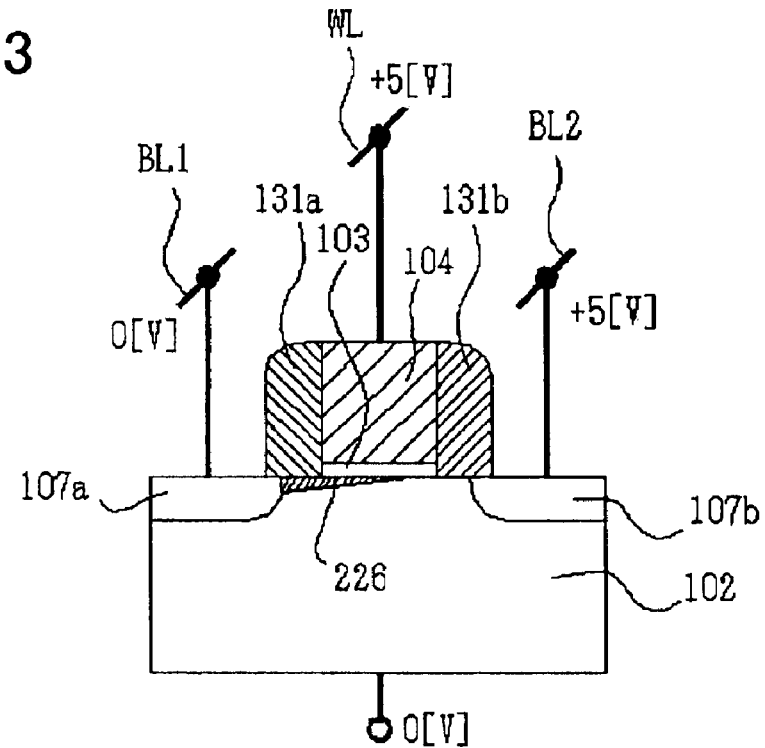
FIG. 3 is a diagram explaining writing operation of the memory element in the semiconductor storage device of Embodiment 1 of the present invention.

For injection (writing) of electrons into the second memory functioning member 131b, assume that an N-type first diffusion region 107a is a source electrode, and an N-type second diffusion region 107b is a drain electrode, as shown in FIG. 3. For example, a voltage of 0V is applied to the N-type first diffusion region 107a and the P-type well region 102, a voltage of +5V is applied to the N-type second diffusion region 107b, and a voltage of +5V is applied to the gate electrode 104. Under such voltage conditions, an inversion layer 226 extends from the first diffusion region 107a (source electrode), but it does not reach the second diffusion region 107b (drain electrode), which causes a pinch-off point. Electrons are accelerated from the pinch-off point to the second diffusion region 107b (drain electrode) with the application of a high electric field, thus turning to so-called hot electrons (high-energy conduction electrons). These hot electrons are injected into the second memory functioning member 131b, whereby a writing operation is carried out. Note that, no hot electrons occur near the first memory functioning member 131a, hence writing operation is not carried out.

Figure 4:
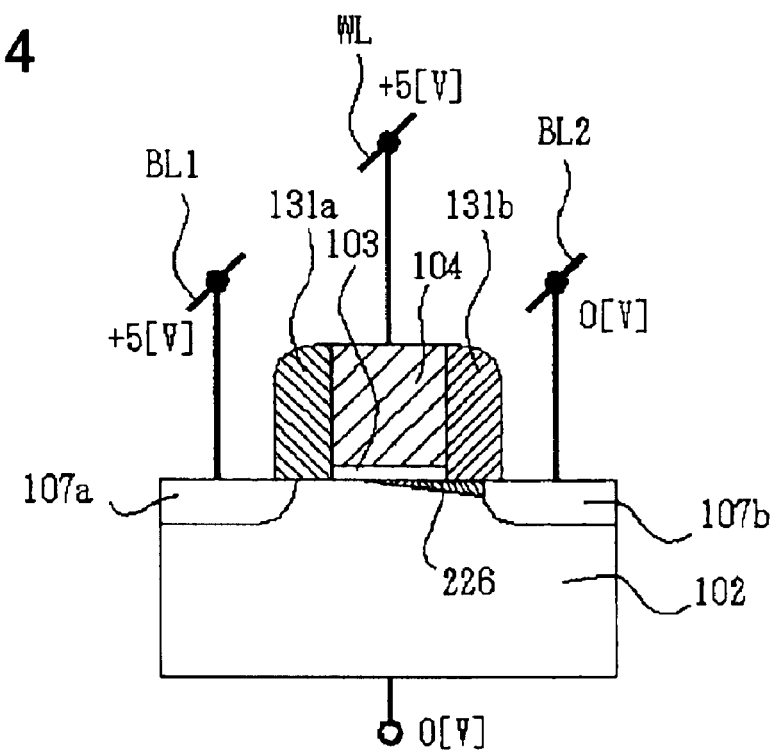
FIG. 4 is a diagram explaining another writing operation of the memory element in the semiconductor storage device of Embodiment 1 of the present invention.

Meanwhile, for injection (writing) of electrons into the first memory functioning member 131a, assume that the second diffusion region 107b is a source electrode, and the first diffusion region 107a is a drain electrode, as shown in FIG. 4. For example, a voltage of 0V is applied to the second diffusion region 107b and the P-type well region 102, a voltage of +5V is applied to the first diffusion region 107a, and a voltage of +5V is applied to the gate electrode 104. Thus, places between source region and drain region is changed from the places in the case when electrons are injected into the second memory functioning member 131b, whereby electrons are injected into the first memory functioning member 131a, thus carrying out writing operation.

Figure 5:
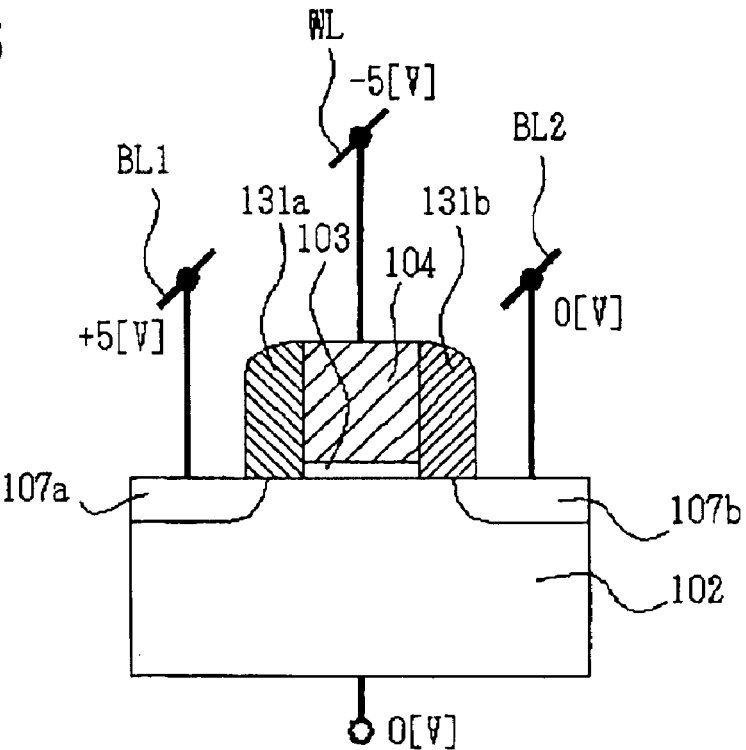
FIG. 5 is a diagram explaining erasing operation of the memory element in the semiconductor storage device of Embodiment 1 of the present invention.
Figure 6:
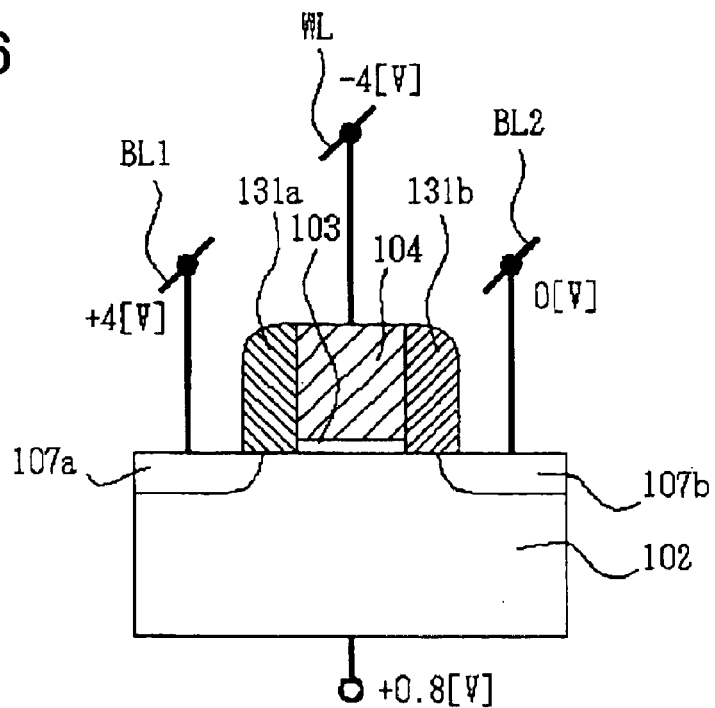
FIG. 6 is a diagram explaining another erasing operation of the memory element in the semiconductor storage device of Embodiment 1 of the present invention.

Next, the following will describe a principle of erasing operation in the memory element with reference to FIG. 5 and FIG. 6.

In the first erasing method of erasing information stored in the first memory functioning member 131a, as shown in FIG. 5, a positive voltage (for example, +5V) is applied to the first diffusion region 107a, and a voltage of 0V is applied to the P-type well region 102 so that a p-n junction between the first diffusion region 107a and the P-type well region 102 is reverse biased, and further, a negative voltage (for example, −5V) is applied to the gate electrode 104. At this moment, because of application of the negative voltage to the gate electrode, a potential gradient especially becomes steep in the vicinity of the gate electrode 104 of the p-n junction. Therefore, hot holes (high-energy positive holes) are induced in the P-type well region 102 of the p-n junction by band-to-band tunneling. The hot holes are attracted in the direction of the gate electrode 104 having negative potential, which results in hole injection in the first memory functioning member 131a. In this manner, an erasing operation in the first memory functioning member 131a is carried out. In this case, it is safe for a voltage of 0V to be applied to the second diffusion region 107b.

For erasing of information stored in the second memory functioning member 131b, it is safe for potentials to be changed between the first diffusion region and the second diffusion region in the above first method. In the second erasing method of erasing information stored in the first memory functioning member 131a, as shown in FIG. 6, a positive voltage (for example, +4V) is applied to the first diffusion region 107a, a voltage of 0V is applied to the second diffusion region 107b, a negative voltage (for example, −4V) is applied to the gate electrode 104, and a positive voltage (for example, +0.8V) is applied to the P-type well region 102. In this method, a forward voltage is applied between the P-type well region 102 and the second diffusion region 107b, causing electrons to be injected into the P-type well region 102. The injected electrons are diffused to the p-n junction between the P-type well region 102 and the first diffusion region 107a and then accelerated with the application of a strong electric field, thus turning to hot electrons. These hot electrons causes electron-hole pairs generated at the p-n junction. That is, application of a forward voltage between the P-type well region 102 and the second diffusion region 107b causes electrons injected into the P-type well region 102 to trigger the generation of hot holes at the p-n junction located on the opposite side. The hot holes generated at the p-n junction are attracted in the direction of the gate electrode 104 having negative potential, which results in hole injection in the first memory functioning member 131a.

According to the method, at the p-n junction between the P-type well region and the first diffusion region 107a, even when a voltage insufficient for the induction of hot holes by band-to-band tunneling is applied, the electrons injected from the second diffusion region 107b trigger the generation of electron-hole pairs at the p-n junction, thus generating hot holes. This makes it possible to decrease a voltage during the erasing operation. Especially, if there exists an offset region 120 (see FIG. 1), the gate electrode to which a negative potential is applied reduces the effect of providing a sharp p-n junction. This has a difficulty of inducing hot holes by band-to-band tunneling; however, the second method compensates for this drawback, thus realizing erasing operation at a low voltage.

Note that, for erasing of information stored in the first memory functioning member 131*a*, the first erasing method requires a voltage of +5V applied to the first diffusion region 107*a*. However, in the second erasing method, a voltage of +4V is enough for the erasing. Thus, according to the second erasing method, it is possible to decrease voltage during the erasing operation, so that power consumption is reduced, thus suppressing deterioration of the memory element caused by hot carriers.

Moreover, both of the erasing methods are less prone to causing overerase phenomenon. The overerase phenomenon is a phenomenon in which as the amount of positive holes accumulated in a memory functioning member increases, a threshold value decreases without saturating. For EEPROM typified by flash memory, the overerase phenomenon is a big problem and causes such a fatal malfunction that selection of memory cell is impossible especially when the threshold value becomes negative. On the other hand, in the memory element of the present semiconductor storage device, a large amount of positive holes accumulated in the memory functioning member only induces electrons under the memory functioning member and has little influence on the potential of the channel region under the gate insulating film. The threshold value during the erasing operation is determined depending on the potential under the gate insulating film, thus it is more likely that no overerase phenomenon occurs.

Figure 7:
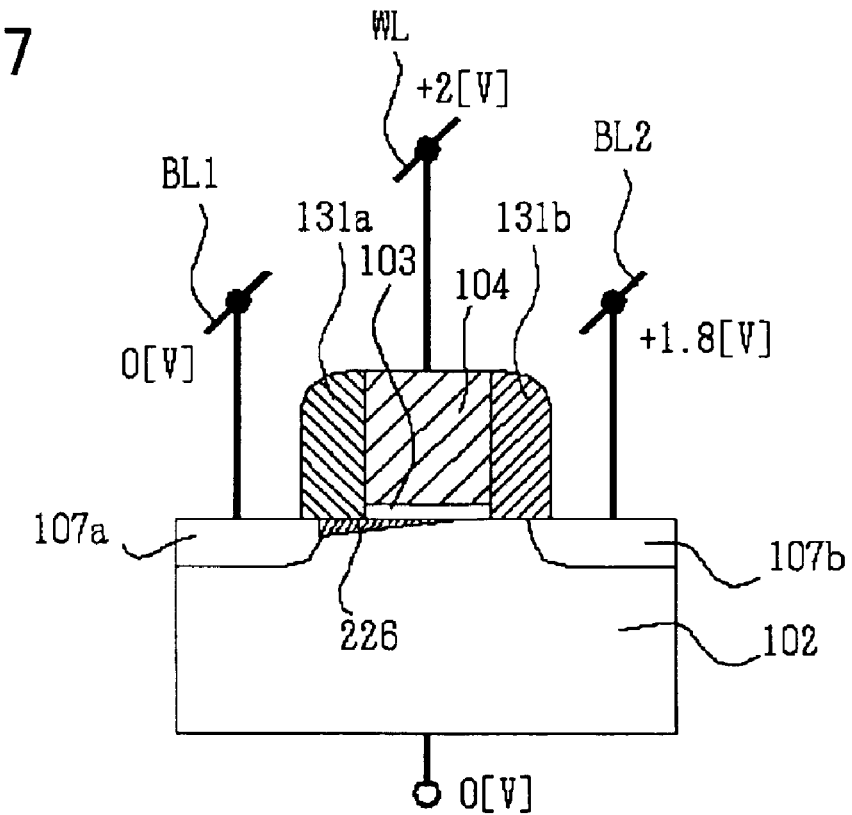
FIG. 7 is a diagram explaining read-out operation of the memory element in the semiconductor storage device of Embodiment 1 of the present invention.

Furthermore, the following will describe a principle of read-out operation in the memory element with reference to FIG. 7.

For read-out of information stored in the first memory functioning member 131*a*, a transistor is activated under the condition where the first diffusion region 107*a* is a source electrode, and the second diffusion region 107*b* is a drain electrode. For example, a voltage of 0V is applied to the first diffusion region 107*a* and the P-type well region 102, a voltage of +1.8V is applied to the second diffusion region 107*b*, and a voltage of +2V is applied to the gate electrode 104. At this moment, when electrons are not accumulated in the first memory functioning member 131*a*, a drain current is more likely to flow. On the other hand, when electrons are accumulated in the first memory functioning member 131*a*, an inversion layer is less prone to being generated in the vicinity of the first memory functioning member 131*a*, so that a drain current is less prone to flowing. Therefore, it is possible to read out information stored in the first memory functioning member 131*a* by detecting a drain current. Especially, in the case where information is read out with the application of such a voltage that would effect pinch-off operation, the state of charges accumulated in the first memory functioning member 131*a* can be judged with higher accuracy regardless of the presence or absence of charges accumulated in the second memory functioning member 131*b*.

For read-out of information stored in the second memory functioning member 131*b*, a transistor is activated under the condition where the second diffusion region 107*b* is a source electrode, and the first diffusion region 107*a* is a drain electrode. For example, it is safe that a voltage of 0V is applied to the second diffusion region 107*b* and the P-type well region 102, a voltage of +1.8V is applied to the first diffusion region 107*a*, and a voltage of +2V is applied to the gate electrode 104. Thus, places between source region and drain region are changed from the places in the case when information stored in the first memory functioning member 131*a* is read out, whereby it is possible to read out information stored in the second memory functioning member 131*b*.

Note that, when there remains a channel region (offset region 120) not covered by the gate electrode 104, an inversion layer is erased or generated depending on the presence or absence of surplus charges in the memory functioning members 131*a* and 131*b*. As a result of this, a large hysteresis (change in threshold value) can be obtained. Note that, too much width of the offset region 120 causes a considerable decrease in the amount of drain current and a dramatic decrease in read-out speed. Therefore, it is preferable to determine a width of the offset region 120 so that sufficient hysteresis and read-out speed can be obtained.

In the case where the diffusion regions 107*a* and 107*b* reach the edges of the gate electrode 104, that is, in the case where the diffusion regions 107*a* and 107*b* overlap the gate electrode 104, a transistor exhibits little change in threshold value by a writing operation, but exhibits a dramatic change in parasitic resistance at the edges of the source and drain regions, decreasing the amount of drain current (decreasing by one or more orders of magnitude). Therefore, read-out can be carried out by detecting a drain current, and it is possible to obtain functions serving as a memory. Note that, when larger hysteresis effect is required, it is preferable that the diffusion regions 107*a* and 107*b* do not overlap the gate electrode 104 (the offset regions 120 exist).

By the above operating methods, one transistor can selectively carry out 2-bit writing and erasing. Memory elements are arranged such that a word line WL, a first bit line BL1, and a second bit line BL2 are respectively connected to the gate electrode 104, the first diffusion region 107*a*, and the second diffusion region 107*b* in the memory element, thereby making up a memory cell array.

Moreover, in the above operating methods, a changing of places between source electrode and drain electrode realizes 2-bit writing and erasing in one transistor. However, places of the source electrode and drain electrode may be fixed so that the transistor can operate as one bit of memory. In this case, one of the source region and the drain region can be a common fixed voltage, thereby halving the number of bit lines connected to the source region and the drain region.

As is clear from the above description, in a memory element of the present semiconductor storage device, memory functioning members are provided independently from the gate insulating film and provided on the opposite sides of the gate electrode, so that 2-bit operations are possible. Further, since the memory functioning members are isolated from each other by the gate electrode, interference between them during writing operation is effectively suppressed. Still further, since the gate insulating film is isolated from the memory functioning members, the thickness of the memory functioning members is reduced, thereby suppressing a short channel effect. This facilitates realization of a finer memory element, and by extension, realization of a finer semiconductor storage device.

[Embodiment 2]

Figure 8:
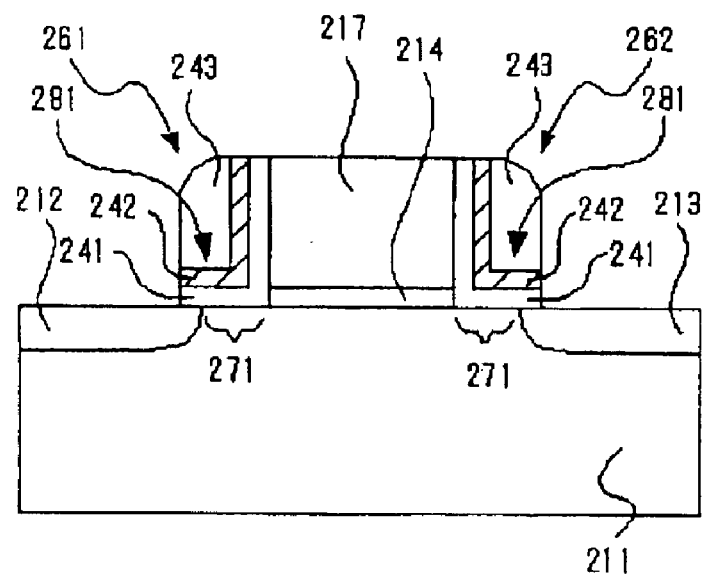
FIG. 8 is a cross-sectional diagram schematically showing a main part of a memory element in a semiconductor storage device of Embodiment 2 of the present invention.

A memory element in a semiconductor storage device of the present embodiment, as shown in FIG. 8, has substantially the same arrangement as that of the memory element 1 in FIG. 1, except for the arrangement in which each memory functioning members 261 and 262 is constituted by a region where charges are held (this region is a region where charges are accumulated and may be a film having a function of holding charges) and a region where charges are less prone to escaping (this region may be a film having a function of making charges less prone to escaping).

In terms of improvement in holding property of memory, the memory functioning members preferably include an insulating film and a charge holding film capable of holding charges. In the present embodiment, a silicon nitride film 242 having a level of trapping charges is used as a charge holding film, and silicon oxide films 241 and 243 capable of preventing the dissipation of charges accumulated in the charge holding film are used as insulating films. The memory functioning member including the charge holding film and the insulating films prevents the dissipation of charges, thereby improving holding property. Moreover, as compared to the constitution of the memory functioning member including the charge holding film alone, the above constitution of the memory functioning member can reduce the volume of the charge holding film to an appropriately small volume, and can restrict transfer of charges inside the charge holding film, thereby suppressing changes of properties caused by the transfer of charges during memory holding. Further, the structure in which the silicon nitride film 242 is sandwiched between the silicon oxide films 241 and 243 enhances a charge injection efficiency during rewriting operation, thus allowing for a higher-speed operation. Note that, in this memory element, the silicon nitride film 242 may be substituted with a ferroelectric substance.

The regions where charges are held (silicon nitride film 242) in the memory functioning members 261 and 262 overlap diffusion regions 212 and 213, respectively. To "overlap" means that at least a part of the region where charges are held (silicon nitride film 242) exists above at least a part of each of the diffusion regions 212 and 213. Note that, reference numeral 211 represents a semiconductor substrate, reference numeral 214 represents a gate insulating film, reference numeral 217 represents a gate electrode, reference numeral 271 represents an offset region of the gate electrode 217 and each of the diffusion regions 212 and 213. An upper surface of the semiconductor substrate 211 beneath the gate insulating film 214 is a channel region (not shown). The following will describe effects brought by the arrangement where the silicon nitride films 242, which are regions where charges are held in the memory functioning members 261 and 262, overlap the diffusion regions 212 and 213.

Figure 9:
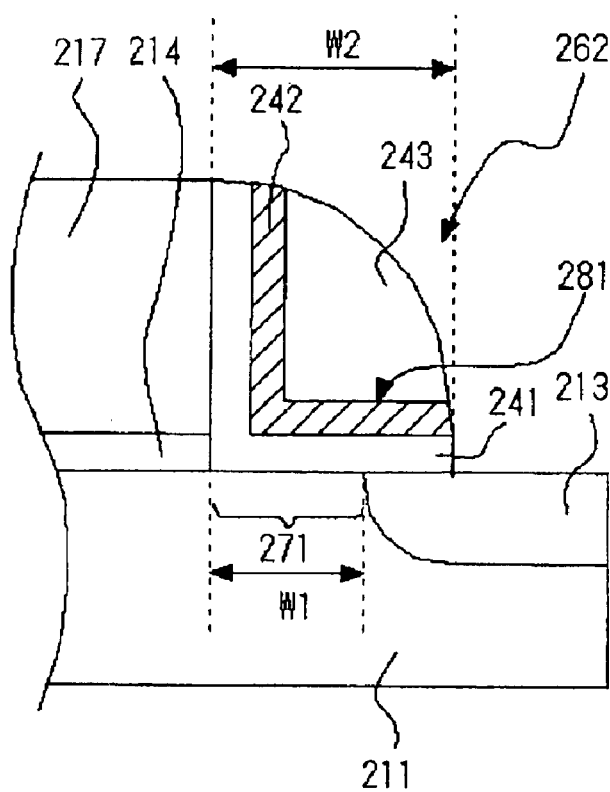
FIG. 9 is a magnified cross-sectional diagram of a main part of a modified memory element in FIG. 8.

As shown in FIG. 9, in the periphery of the memory functioning member 262, when the amount of offset between the gate electrode 217 and the diffusion region 213 is W1, and a width of the memory functioning member 262 in a cross section in the channel length direction of the gate electrode is W2, the amount of overlap between the memory functioning member 262 and the diffusion region 213 is expressed by W2−W1. Here, it is important that the part including the silicon nitride film 242 in the memory functioning member 262 overlaps the diffusion region 213, that is, the relation W2>W1 is satisfied.

Figure 10:
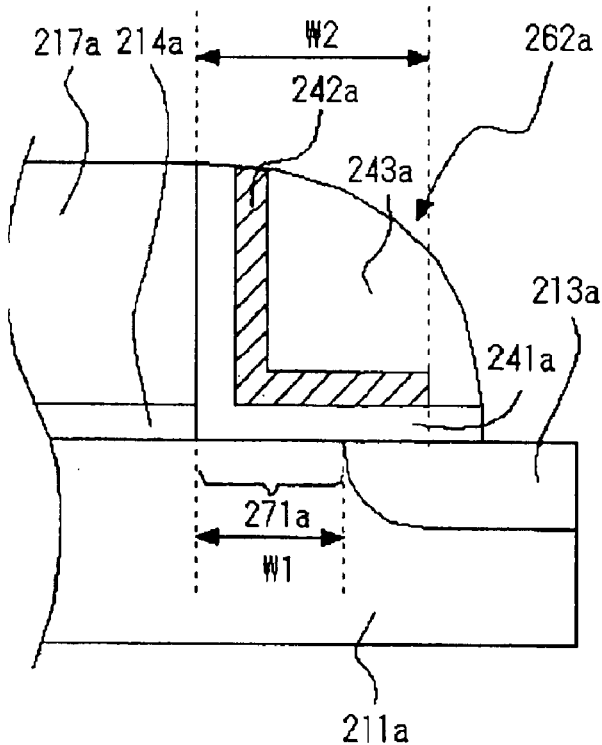
FIG. 10 is a magnified cross-sectional diagram of a main part of a modified memory element in FIG. 8.

In FIG. 9, a width of the memory functioning member 262 is denoted by W2 because the edge of the silicon nitride film 242 on the side distant from the gate electrode 217 matches the edge of the memory functioning member 262 on the side distant from the gate electrode 217. However, as shown in FIG. 10, when the edge of the silicon nitride film 242a on the side distant from the gate electrode does not match the edge of the memory functioning member 262a on the side distant from the gate electrode, W2 should be defined as the distance from the edge of the gate electrode to the edge of the silicon nitride film 142a on the side distant from the gate electrode.

Figure 11:
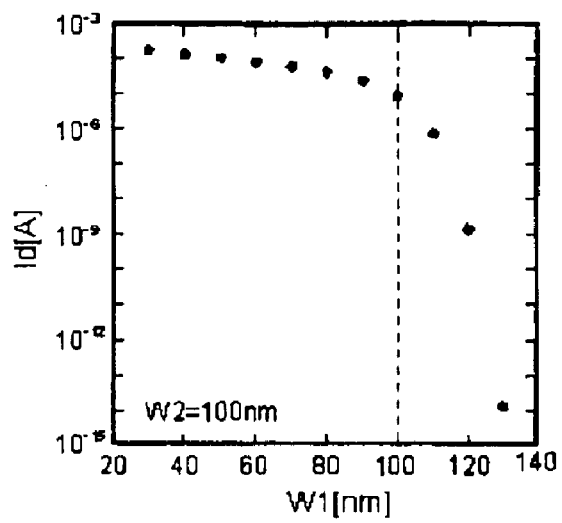
FIG. 11 is a graph showing an electric property of a memory element in a semiconductor storage device of Embodiment 2 of the present invention.

FIG. 11 shows a drain current Id with changes in the amount of offset W1 when the width W2 of the memory functioning member 262 is fixed to 100 nm in a structure of the memory element in FIG. 9. Here, values of the drain current were obtained by a device simulation under the condition where the memory functioning member 262 is in an erased state (includes holes accumulated therein) and the diffusion regions 212 and 213 are source electrode and drain electrode, respectively. As is apparent from FIG. 11, when W1 is 100 nm or more (that is, the silicon nitride film 242 does not overlap the diffusion region 213), the drain current decreases rapidly. The value of the drain current is appropriately in proportion to a read-out speed. Therefore, when W1 is 100 nm or more, the performance of memory is rapidly degraded. On the other hand, when W1 is a value in the range where the silicon nitride film 242 overlaps the diffusion region 213, the drain current decreases moderately. Therefore, considering that variations in mass production process, if at least a part of the silicon nitride film 242, which is a film capable of holding charges, does not overlap the source region and drain region, it is practically difficult to obtain memory function.

In view of the result of the above-mentioned device simulation, memory cell arrays with W1 of 60 nm and 100 nm as design value were prepared under the condition where W2 is fixed to 100 nm. When W1 is 60 nm, there is an overlap of 40 nm as a design value between the silicon nitride film 142 and the diffusion regions 212 and 213. When W1 is 100 nm, there is no overlap between them. When comparing results of a read-out time measurement between these memory cell arrays in the worst case considering variations, the memory cell array with W1 of 60 nm reads at a speed of 100 times faster in a read-out access time than the memory cell array with W1 of 100 nm. Practically, a read-out access time is preferably 100 nanoseconds or less per bit; however, when W1=W2, it is impossible to achieve this condition. In view of variations in manufacturing process, (W2−W1)>10 nm is more preferable.

For read-out of information stored in the memory functioning member 261 (region 281), as in the case of Embodiment 1, it is preferable that the diffusion region 212 and the diffusion region 213 are source electrode and drain region, respectively, and a pinch-off point is formed in the channel region, at a point closer to the drain region. That is, in reading out information stored in one memory functioning member of two memory functioning members, a pinch-off point is preferably formed in the channel region, in a region closer to the other memory functioning member. This makes it possible to detect information stored in the memory functioning member 261 at a good sensitivity regardless of storage conditions in the memory functioning member 262. This is a great factor for the realization of two-bit operation.

On the other hand, when information is stored in only one memory functioning member of two memory functioning members, or when the two memory functioning members are used with the same storage conditions, the formation of a pinch-off point is not always needed for read-out operation. Note that, it is preferable that a well region (for N channel element, P-type well), not shown in FIG. 8, is formed on the surface of the semiconductor substrate 211. The formation of a well region facilitates control of other electric properties (property of withstanding voltage, junction capacitance, short channel effect) while optimizing impurity concentration in the channel region for memory operations (writing operation and read-out operation).

Figure 12:
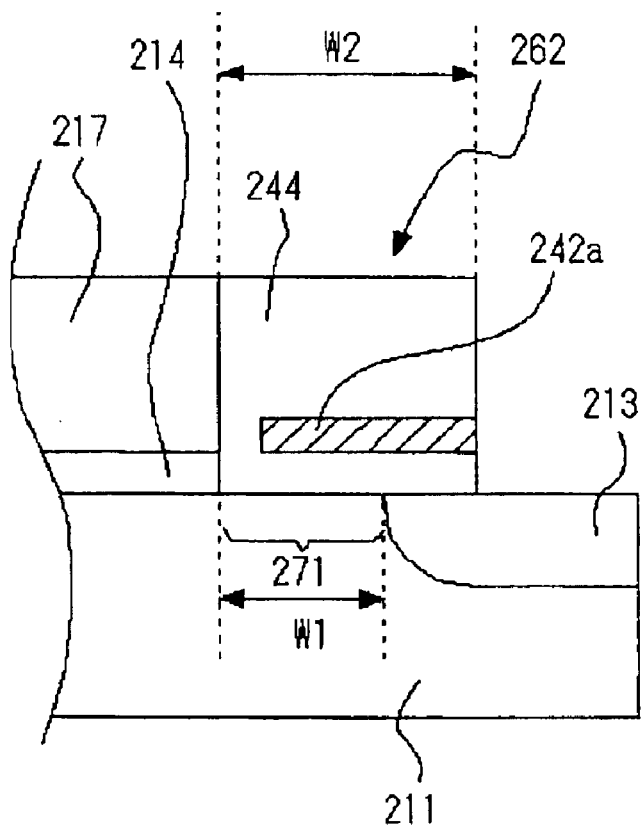
FIG. 12 is a cross-sectional diagram schematically showing a main part of a modified memory element in the semiconductor storage device of Embodiment 2 of the present invention.

It is preferable that the memory functioning member includes a charge holding film arranged substantially parallel to the surface of the gate insulating film. In other words, it is preferable that the upper surface of the charge holding film in the memory functioning member is arranged so as to be located at a place a given distance from the upper surface of the gate insulating film. Specifically, as shown in FIG. 12, the silicon nitride film 242a, which is a charge holding film in the memory functioning member 262, has a surface substantially parallel to the surface of the gate insulating film 214. In other words, it is preferable that the silicon nitride film 242a is formed at a uniform height from the level corresponding to the surface of the gate insulating film 214.

Existence of the silicon nitride film 242a which is substantially parallel to the surface of the gate insulating film 214 in the memory functioning member 262 can effectively control the tendency of forming an inversion layer in the offset region 271 by the amount of charges accumulated in the silicon nitride film 242a, and by extension can enhance a memory effect. Further, the arrangement in which the silicon nitride film 242a is substantially parallel to the surface of the gate insulating film 214 can reduce a change of memory effect to a relatively small change even when the amount of offset (W1) varies, thus suppressing varying degrees of memory effect. In addition, it is possible to suppress upward transfer of charges in the silicon nitride film 242a and to prevent changes in properties during memory holding, caused by transfer of charges.

Further, it is preferable that the memory functioning member 262 includes the insulating film (For example, a portion in the silicon oxide film 244 on the offset region 271) isolating the silicon nitride film 242a, which is substantially parallel to the surface of the gate insulating film 214, from the channel region (or well region). This insulating film prevents the dissipation of charges accumulated in the charge holding film, thus attaining a memory element having a much better holding property.

Note that, by controlling a film thickness of the silicon nitride film 242a and by controlling a film thickness of the insulating film (a portion of the silicon oxide film 244 above the offset region 271) beneath the silicon nitride film 242a to uniform thickness, it is possible to maintain a distance from the surface of the semiconductor substrate to charges accumulated in the charge holding film to a substantially uniform distance. That is, a distance from the surface of the semiconductor substrate to charges accumulated in the charge holding film can be controlled to a distance value between a minimum value of film thickness of the insulating film beneath the silicon nitride film 242a and a sum of a maximum value of film thickness of the insulating film beneath the silicon nitride film 242a and a maximum value of film thickness of the silicon nitride film 242a. This makes it possible to control a density of electric flux lines caused by charges accumulated in the silicon nitride film 242a and to extremely reduce varying degrees of memory effect of the memory element.

[Embodiment 3]

Figure 13:
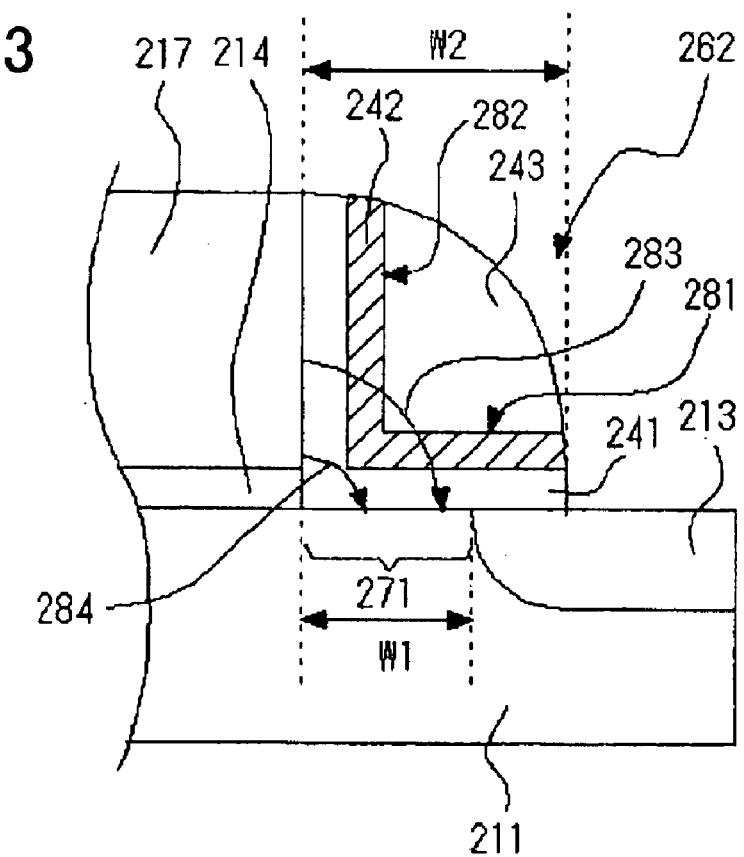
FIG. 13 is a cross-sectional diagram schematically showing a main part of a memory element in the semiconductor storage device of Embodiment 3 of the present invention.

As shown in FIG. 13, a memory functioning member 262 in the semiconductor storage device of the present embodiment includes a silicon nitride film 242, which is a charge holding film, with substantially uniform film thickness, having a region 281 which is arranged substantially parallel to the surface of the gate insulating film 214 and a region 282 which is arranged substantially parallel to the side surface of the gate electrode 217.

When a positive voltage is applied to a gate electrode 217, an electric flux line 283, as indicated by arrow, in a memory functioning member 262, passes through the silicon nitride film 242 twice (the region 282 and the region 281). Note that, when a negative voltage is applied to the gate electrode 217, an electric flux line reverses its direction. Here, the silicon nitride film 242 has a relative permittivity of approximately 6, and the silicon oxide films 241 and 243 have a relative permittivity of approximately 4. This arrangement of the present embodiment can make an effective relative permittivity in the direction of the electric flux line larger and make a difference in potential between both ends of the electric flux line smaller than the arrangement in which the region 281 alone exists in the charge holding film. That is, a large part of the voltage applied to the gate electrode 217 is used to strengthen an electric field in the offset region 271.

Injection of charges into the silicon nitride film 242 during rewriting operation occurs because generated charges are attracted by an electric filed in the offset region 271. Therefore, inclusion of the charge holding film indicated by the arrow 282 increases the amount of charges injected into the memory functioning member 262 during rewriting operation, thus increasing a rewriting speed. Note that, if the part corresponding to the silicon oxide film 243 is also a silicon nitride film, that is, the charge holding film is not at a uniform height with respect to the level of the surface of the gate insulating film 214, upward transfer of charges in the silicon nitride film becomes pronounced, resulting in degradation of the holding property.

It is more preferable that the charge holding film is made up of dielectric material such as hafnium oxide having a very high relative permittivity, instead of silicon nitride film. Further, it is preferable that the memory functioning member further includes an insulating film (a portion in the silicon oxide film 241 above the offset region 271) isolating the charge holding film, which is substantially parallel to the surface of the gate insulating film, from a channel region (or well region). This insulating film prevents the dissipation of charges accumulated in the charge holding film, further enhancing holding property.

Moreover, it is preferable that the memory functioning member further includes an insulating film (a portion of the silicon oxide film 241 in contact with the gate electrode 217) isolating the gate electrode from the charge holding film extending substantially parallel to the side surface of the gate electrode. This insulating film prevents change in electric properties caused by injection of charges from the gate electrode to the charge holding film, thus enhancing reliability of a memory element. Further, as in the case of Embodiment 2, it is preferable that a film thickness of an insulating film (a portion of the silicon oxide film 241 above the offset region 271) beneath the silicon nitride film 242 is controlled to a uniform thickness, and a film thickness of an insulating film (a portion of the silicon oxide film 241 in contact with the gate electrode 217) arranged on the side surface of the gate electrode is controlled to a uniform thickness. This makes it possible to generally control a density of electric flux lines which are caused by charges accumulated in the silicon nitride film 242 and to prevent leakage of charges.

[Embodiment 4]

In the present embodiment, the following will describe optimization of a length of a gate electrode, a distance between memory functioning members, and a distance between a source region and a drain region in a memory element of a semiconductor storage device.

Figure 14:
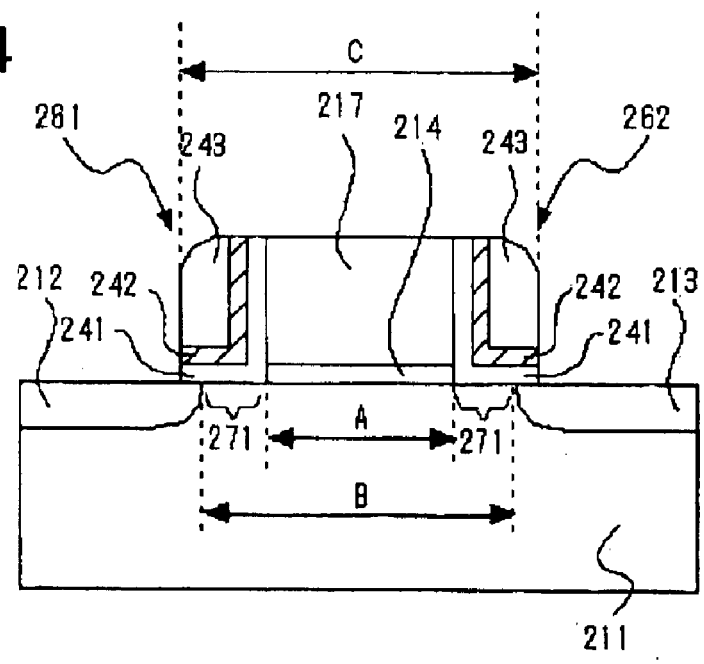
FIG. 14 is a cross-sectional diagram schematically showing a main part of a memory element in the semiconductor storage device of Embodiment 4 of the present invention.

As shown in FIG. 14, A denotes a length of a gate electrode in a cross section in the channel length direction, B denotes a distance (channel length) between a source region and a drain region, and C denotes a distance from the edge of one memory functioning member to the edge of the other memory functioning member, that is, a distance from the edge of a film capable of holding charges in one memory functioning member in a cross section in the channel length direction (the edge of the film which is distant from the gate electrode) to the edge of a film capable of holding charges in the other memory functioning member (the edge of the film which is distant from the gate electrode).

In such a memory element, B<C is preferable. By satisfying such a relation, there exists offset regions 271 between a part of the channel region located beneath the gate electrode 217 and a diffusion region 212 and between the part of the channel region located beneath the gate electrode 217a and a diffusion region 213. With this arrangement, in all of the offset regions 271, easiness of inversion effectively varies depending on charges accumulated in the memory functioning members 261 and 262 (silicon nitride films 242). This causes enhancement in memory effect and especially realizes speedup of read-out operation.

When there exists offsets between the gate electrode 217 and the diffusion region 212 and between the gate electrode 217 and the diffusion region 213, that is, when A<B, ease of inversion in the offset regions, when a voltage is applied to the gate electrode, drastically varies depending on the amount of charges accumulated in the memory functioning members, thus realizing enhancement in memory effect, and especially reduction in short channel effect.

Incidentally, existence of the offset regions 271 is not always needed as long as memory effect shows up. In the case where the offset regions 271 do not exist, if impurity concentration in the diffusion regions 212 and 213 is low enough, memory effect can show up in the memory functioning members 261 and 262 (silicon nitride films 242). In view of this, A<B<C is the most preferable relation.

[Embodiment 5]

Figure 15:
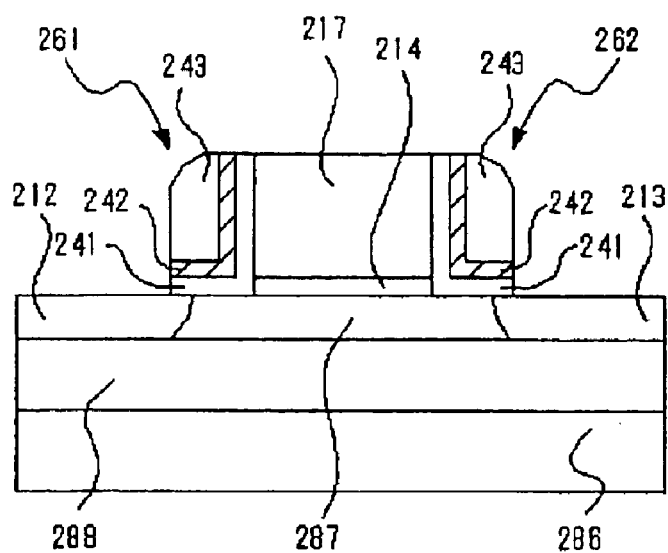
FIG. 15 is a cross-sectional diagram schematically showing a main part of a memory element in the semiconductor storage device of Embodiment 5 of the present invention.

As shown in FIG. 15, a memory element in a semiconductor storage device of the present embodiment has substantially the same arrangement as that of the memory element in Embodiment 2, except for the arrangement in which the semiconductor substrate in Embodiment 2 is replaced with a SOI substrate.

This memory element has an arrangement in which an embedded oxide film 288 is formed on a semiconductor substrate 286, and an SOI layer is further formed thereon. The SOI layer includes diffusion regions 212 and 213 and a body region 287 which is a region except for the diffusion regions 212 and 213 in the SOI layer.

This memory element can bring about the same effect as that of the memory element in Embodiment 2. Moreover, this memory element can significantly reduce the amount of junction capacitance of the diffusion regions 212 and 213 and the body region 287, thus allowing for speedup of a device and lower power consumption.

[Embodiment 6]

Figure 16:
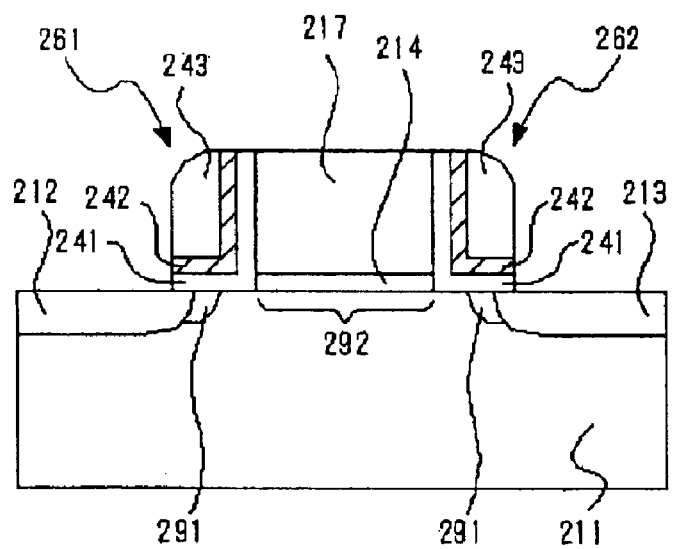
FIG. 16 is a cross-sectional diagram schematically showing a main part of a memory element in the semiconductor storage device of Embodiment 6 of the present invention.

As shown in FIG. 16, a memory element in a semiconductor storage device of the present embodiment has substantially the same arrangement as that of the memory element in Embodiment 2, except for the arrangement in which P-type high concentration regions 291 are additionally provided adjacent to ends of N-type diffusion regions 212 and 213 facing a channel region. More specifically, concentration of impurity giving a P-type nature (for example, boron) to the P-type high concentration regions 291 is higher than that of impurity giving a P-type nature to a region 292. Suitable P-type impurity concentration in the P-type high concentration regions 291 is, for example, in the order of $5 \times 10^{17}$ cm to $1 \times 10^{19}$ cm$-3$. Also, P-type impurity concentration in the region 292 can be, for example, $5 \times 10^{16}$ cm to $1 \times 10^{18}$ cm$-3$.

Thus, provision of the P-type high concentration regions 291 causes a sharp junction of the diffusion regions 212 and 213 and a semiconductor substrate 211 directly beneath the memory functioning members 261 and 262. Therefore, hot carriers are more likely to be generated during writing and erasing operations, allowing for a decrease in voltage for writing and erasing operations or speedup of writing and erasing operations. Further, a relatively low impurity concentration in the region 292 causes a low threshold value when memory is in a state of being erased, thus increasing the amount of drain current. This increases a read-out speed. Therefore, it is possible to obtain a memory element with a low rewriting voltage or a high rewriting speed, and a high read-out speed.

In FIG. 16, provision of the P-type high concentration regions 291 beneath the memory functioning members (that is, not directly beneath the gate electrode) in the vicinity of a source region and a drain region remarkably increases a threshold value of the entire transistor. An extent of this increase is remarkably larger than that in the case where there are the P-type high concentration regions 291 directly beneath the gate electrode. When writing charges (electrons in a case where the transistor is N-channel type transistor) are accumulated in the memory functioning member, the difference between the threshold values become much larger. On the other hand, when enough erasing charges (positive holes in a case where the transistor is N-channel type transistor) are accumulated in the memory functioning member, a threshold value of the entire transistor drops to a threshold value determined depending on impurity concentration in the channel region (region 292) beneath the gate electrode. That is, a threshold value during erasing operation does not depend on impurity concentration in the P-type high concentration regions 291, whereas a threshold value during writing operation is significantly affected by impurity concentration in the P-type high concentration regions 291. Therefore, arrangement of the P-type high concentration regions 291 beneath the memory functioning members in the vicinity of the source region and drain region remarkably varies only a threshold value during writing operation, thus allowing for significant enhancement in memory effect (difference in threshold value between writing operation and erasing operation).

[Embodiment 7]

Figure 17:
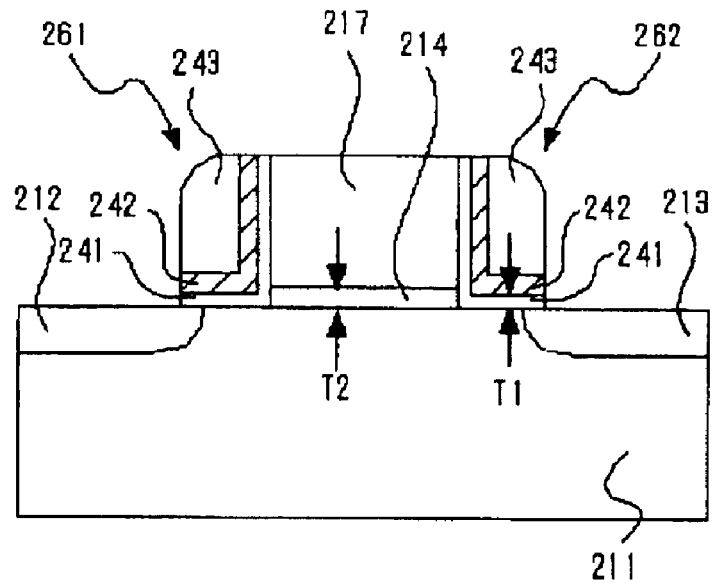
FIG. 17 is a cross-sectional diagram schematically showing a main part of a memory element in the semiconductor storage device of Embodiment 7 of the present invention.

As shown in FIG. 17, a memory element in a semiconductor storage deice of the present embodiment has substantially the same arrangement as that of the memory element in Embodiment 2, except for the arrangement in which a thickness (T1) of an insulating film isolating a charge holding film (silicon nitride film 242) from a channel region or well region is smaller than a thickness (T2) of a gate insulating film.

With the demand for the property of withstanding voltage during writing operation of memory, the gate insulating film 214 has a lower limit of the thickness T2. However, the thickness T1 of the insulating film can be smaller than the thickness T2, regardless of the demand for the property of withstanding voltage.

In this memory element, as described above, a high degree of flexibility in the thickness T1 results from the following grounds.

That is, in this memory element, the insulating film isolating a charge holding film from the channel region or the well region is not sandwiched between the gate electrode and the channel region or well region. Therefore, the insulating film isolating the charge holding film from the channel region or well region is not directly effected not by a high electric field between the gate electrode and the channel region or the well region, but is effected by a relatively weak electric filed extending from the gate electrode in the lateral direction. Therefore, regardless of the demand for the property of withstanding voltage with respect to the gate insulating film, the thickness T1 can be smaller than the thickness T2.

Reduction of the thickness T1 facilitates injection of charges into the memory functioning members, thus allowing for decrease in voltage during writing and erasing operations or speedups of writing and erasing operations. Also, reduction of the thickness T1 increases the amount of charges induced in the channel region or well region when charges are accumulated in the silicon nitride film 242, thus allowing for enhancement in memory effect.

By the way, among electric flux lines in the memory functioning members, there is a short one, as indicated by an arrow 284 in FIG. 13, that does not pass through the silicon nitride film 242. An electric field intensity on such a short electric flux line is relatively high, so that an electric field along this electric flux line plays a large role in writing operation. Reduction of the thickness T1 causes the silicon nitride film 242 to move downward in the drawing, so that the electric flux line indicated by the arrow 283 can pass through the silicon nitride film. This causes a high effective relative permittivity in the memory functioning member along the electric flux line 284, thus allowing for a smaller difference in potential between both ends of the electric flux line. Therefore, a large part of voltage applied to the gate electrode 217 is used to strengthen an electric field in the offset region, thus permitting speedups of writing and erasing operations.

To the contrary, in EEPROM typified by a flash memory, for example, an insulating film isolating a floating gate from a channel region or well region is sandwiched between a gate electrode (control gate) and the channel region or well region, so that the insulating film is directly effected by a high electric field from the gate electrode. Therefore, in the EEPROM, a thickness of the insulating film isolating the floating gate from the channel region or well region is limited, which inhibits the optimization for the functions of the memory element.

As is obvious from the above description, the relation T1<T2 allows for decrease in voltage during writing and erasing operations or speedup of writing and erasing operations, without decrease in voltage resisting performance of memory and further allows for enhancement in memory effect.

Note that, it is more preferable that the thickness T1 of the insulating film is 0.8 nm or more at which uniformity and film quality of the insulating film in manufacturing process can be maintained to a certain level, and which is a limit at which holding property does not degrade to an extreme.

Specifically, for a liquid crystal driver LSI with a large design rule which requires a high withstand voltage, a maximum voltage 15V to 18V is required to drive a liquid crystal panel TFT. Because of this, it is usually impossible to reduce the thickness of a gate oxide film. When a nonvolatile memory of the present embodiment for image control-use is mixed into the liquid crystal driver LSI, in the memory element of the present invention, it is possible to design a suitable thickness of the insulating film insulating a charge holding film (silicon nitride film 242) from the channel region or well region, independently from the thickness of the gate insulating film. For a memory cell with a gate electrode length (word line width) of 250 nm, for example, T1=20 nm and T2=10 nm can be set individually, thus realizing a memory cell of an excellent efficiency of writing. (The reason why no short channel effect occurs with the thickness T1 that is larger than that of an ordinary logic transistor is that a source region and a drain region are offset from the gate electrode.)

[Embodiment 8]

Figure 18:
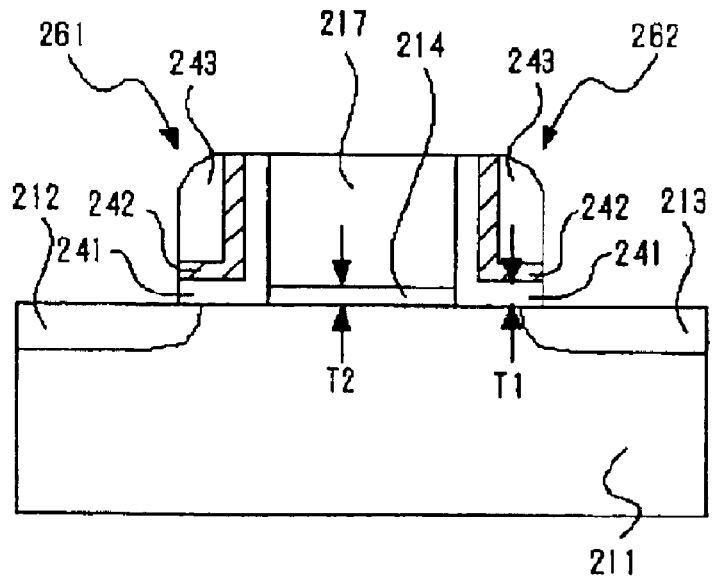
FIG. 18 is a cross-sectional diagram schematically showing a main part of a memory element in the semiconductor storage device of Embodiment 8 of the present invention.

As shown in FIG. 18, a memory element in a semiconductor storage device of the present embodiment has substantially the same arrangement as that of the memory element in Embodiment 2, except for the arrangement in which a thickness (T1) of an insulating film isolating a charge holding film (silicon nitride film 242) from a channel region or well region is larger than a thickness (T2) of a gate insulating film.

For a requirement for the prevention of short channel effect of a device, a gate insulating film 214 has an upper limit of its thickness T2. However, the thickness T1 of the insulating film can be larger than the thickness T2, regardless of the requirement for the prevention of short channel effect. That is, for the development of scaling down (the development of reduction in thickness of the gate insulating film), a thickness of an insulating film isolating the charge holding film (silicon nitride film 242) from the channel region or well region can be designed suitably, independently from a thickness of the gate insulating film. This brings about the effect that the memory functioning members do not impair scaling down.

In the memory element of the present embodiment, the reason for a high degree of flexibility in the thickness T1 is, as described above, that the insulating film isolating the charge holding film from the channel region or well region is not sandwiched between the gate electrode and the channel region or well region. Therefore, the thickness T1 can be larger than the thickness T2, regardless of the requirement for the prevention of short channel effect with respect to the gate insulating film. Increase in thickness T1 enables the prevention of charges accumulated in the memory functioning members from scattering and improvement of holding property of memory.

Consequently, the relation T1>T2 enables improvement in holding property without degradation of short channel effect of memory.

Note that, the thickness T1 of the insulating film is preferably 20 nm or less, considering a decrease in rewriting speed.

More specifically, in a conventional nonvolatile memory typified by flash memory, a selection gate electrode constitutes a writing/erasing gate electrode, and a gate insulating film (including a floating gate) corresponding to the write-erasing gate electrode also serves as charge accumulating film. Therefore, the demand for a finer memory element (a thinner film is essential for the prevention of short channel effect) and the demand for securement of reliability (For prevention of leakage of holding charges, the thickness of an insulating film isolating the floating gate from the channel region or the well region cannot be reduced to about 7 nm or less.) are mutually contradictory, and hence, it is difficult to realize a finer memory element. Actually, according to ITRS (International Technology Roadmap for Semiconductors), a thinner physical gate length of about 0.2 micrometer or thinner is not yet in sight. However, in the memory element of the present embodiment, as described above, T1 and T2 can be designed individually, thus realizing a fine film structure.

For example, for a memory cell with a gate electrode length (word line width) of 45 nm, it is possible to realize a memory element which causes no short channel effect by individually setting the memory cell to T2=4 nm and T1=7 nm. The reason why no short channel effect occurs even when T2 is set thicker than a thickness of an ordinary logic transistor is because the source region and the drain region are offset with respect to the gate electrode. Further, in the memory element of the present embodiment, the source region and the drain are offset with respect to the gate electrode, thus further facilitating a finer memory element, as compared to an ordinary logic transistor.

That is, since an electrode for assisting writing and erasing does not exist in an upper part of the memory functioning member, a high electric field acting between the electrode for assisting writing and erasing and the channel region or well region does not directly act on the insulating film isolating the charge holding film from the channel region or the well region but only a relatively low electric field which spreads in the horizontal direction from the gate electrode acts. Therefore, it is possible to realize a memory element holding a gate length as thin as or thinner than a gate length of a logic transistor in the same fabrication generation.

[Embodiment 9]

A present embodiment relates to a change in electric properties, the change being caused when a memory element is rewritten in a semiconductor storage device.

Figure 19:
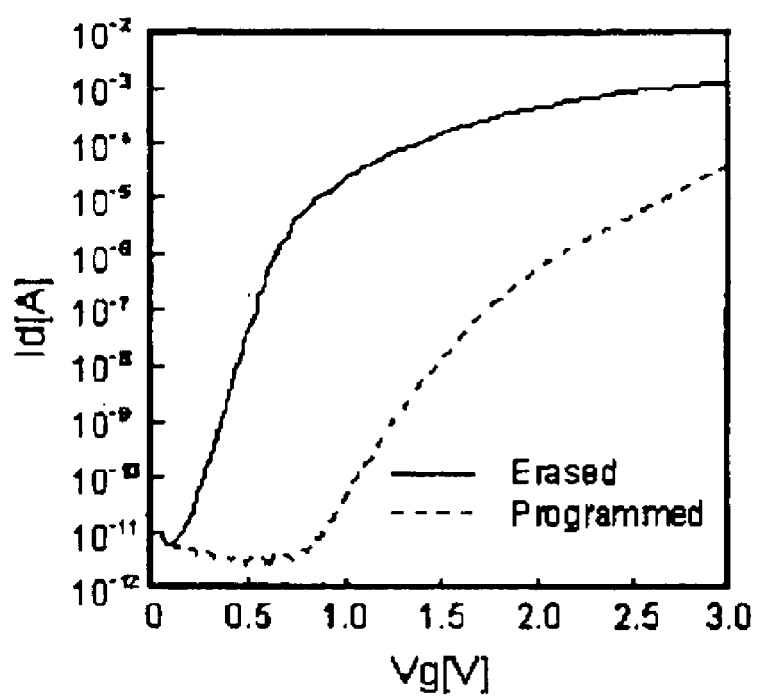
FIG. 19 is a graph showing an electric property of a memory element in a semiconductor storage device of Embodiment 9 of the present invention.

In an N-channel type memory element, a change in an amount of charge in a memory functioning member results in drain current (Id)-gate voltage (Vg) characteristics (measured values), as shown in FIG. 19.

As shown in FIG. 19, a writing operation starting from erased state (solid line) not only increases a threshold value, but also significantly decreases the gradient of the graph in a sub-threshold region. Therefore, even in a region in which the gate voltage (Vg) is relatively high, a drain current ratio between an erasing state and a writing state is large. For example, where Vg=2.5V, the current ratio is in two digits or more. This characteristics is significantly different from that of the flash memory (see FIG. 31)

The appearance of this characteristic is a unique phenomenon caused because an offset between a gate electrode and a diffusion region makes it difficult for a gate electric field to enter an offset region. When the memory element is in the writing state, it is very difficult to generate an inversion layer in the offset region under the memory functioning member, even if a positive voltage is applied on the gate electrode. This is the reason why the gradient of the Id-Vg curve is small in the sub-threshold region when the memory element is in the writing state.

On the other hand, when the memory element is in the erasing state, electrons are induced in high density in the offset region. Further, when a voltage of 0V is applied on the gate electrode (that is, when the memory element is in an off state), no induction of electrons is caused in a channel under the gate electrode (therefore, an off current is small). This is the reason why the Id-Vg curve has a large gradient in the sub-threshold region and an increasing rate (conductance) of current is large in the regions at or above the threshold value, when the memory element is in the erasing state.

As described above, the memory element constituting the semiconductor storage device of the present embodiment is capable of attaining an especially large drain current ratio between in writing and in erasing.

[Embodiment 10]

A present embodiment relates to a semiconductor storage device in which memory elements described in Embodiments 1 to 8 are arrayed. More particularly the present embodiment relates to a word line driver circuit for reading and writing/erasing operations in the semiconductor storage device.

In the present embodiment, (i) a design of the word line driver circuit for the reading and writing/erasing operations, and (ii) a circuit to be used in a non-volatile memory of the present embodiment are described. The following details are described in order to facilitate understanding. However, it will be evident that even without such details the description enables one skilled in the art to practice the present invention. In the other embodiments, well-known arts and arrangements are not described in order to avoid making the description of the present invention unclear.

Figure 20:
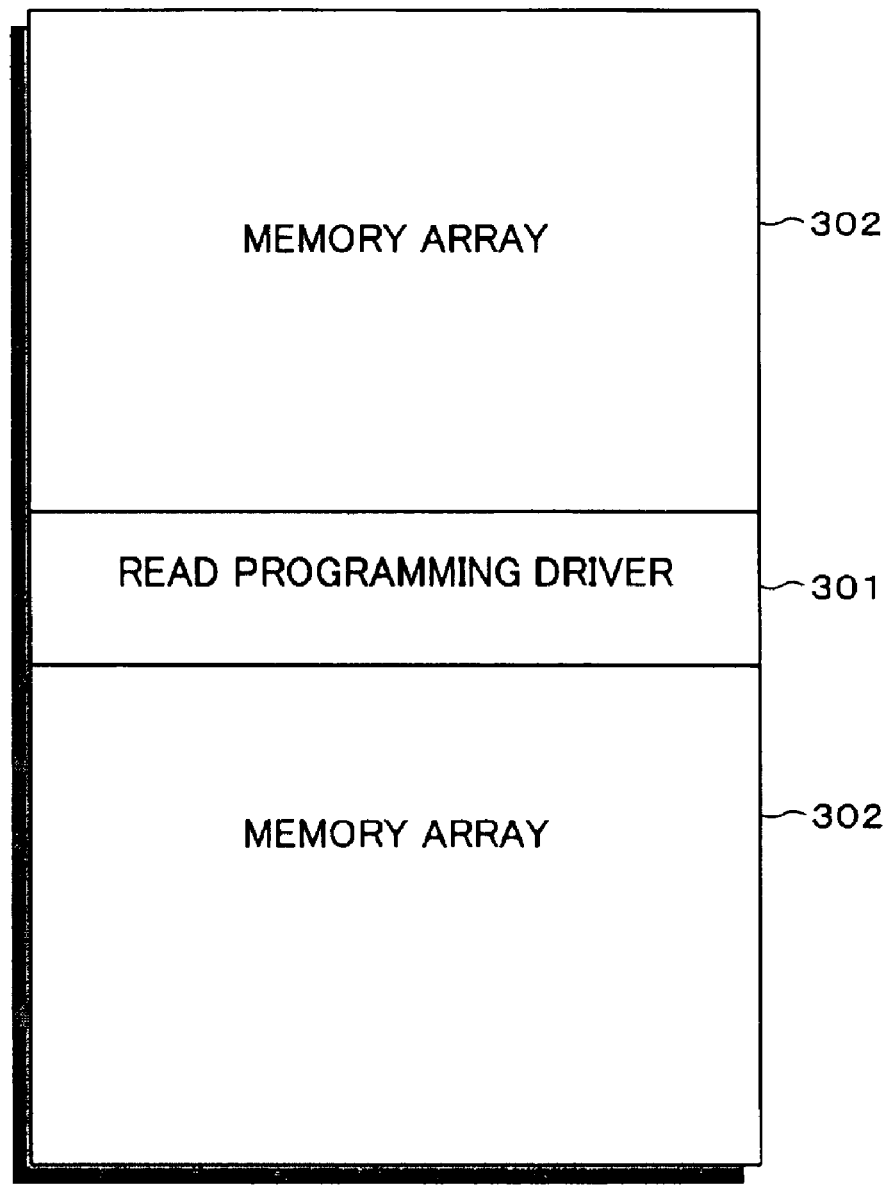
FIG. 20 is a block diagram illustrating a semiconductor storage device of an Embodiment 10 of the present invention.

FIG. 20 shows an arrangement of the semiconductor storage device including a memory array and the word line driver circuit of the present embodiment.

A read programming driver 301, which includes a plurality of the present word line driver circuits, is provided for reading and writing/erasing operation for memory arrays 302. The memory arrays 302 are so arranged as a two-dimensional matrix array in which memory cells are arrayed in rows and columns. However, the memory arrays 302 are not limited to this arrangement. The arrangement is so improved that the single read programming driver 301 is formed by combining a reading driver circuit and a writing/erasing driver circuit, the single read programming driver 301 operating together with both the memory arrays 302. This arrangement attains a smaller circuit size of the peripheral circuit that is used together with the memory arrays 302. By arranging such that the read programming driver 301 required to have a smaller number of elements in a pitch constrained region, it is possible to provide the memory cells of the present embodiment and to provide the memory cells with a higher density.

Usually, memory arrays are so laid out that minimum transistors are arrayed in matrix (in rows and columns) without any space therebetween, in order to increase capacity per area as much as possible for attaining a lower cost. On the other hand, the word line driver circuits of the present embodiment, which are provided one for each row of the memory arrays, drive at once all gates of the memory cells arrayed in the row to which it belongs. Therefore, the word line driver circuits of the present embodiments need a transistor larger than a memory cell transistor. However, for example, if the word line driver circuits have a width with respect to a row direction; that is, a length along a column direction) which is wider than a width of the memory arrays, the width of the word line driver circuits determines a width of the circuit formed by combining the word line driver circuits and the memory arrays. In order to avoid this, it is necessary that the width of the word line driver circuits be equal to or narrower than the width of the memory arrays. That is, it is necessary to layout the word line driver circuits in a region constrained in terms of pitches of the memory cells.

Figure 22:
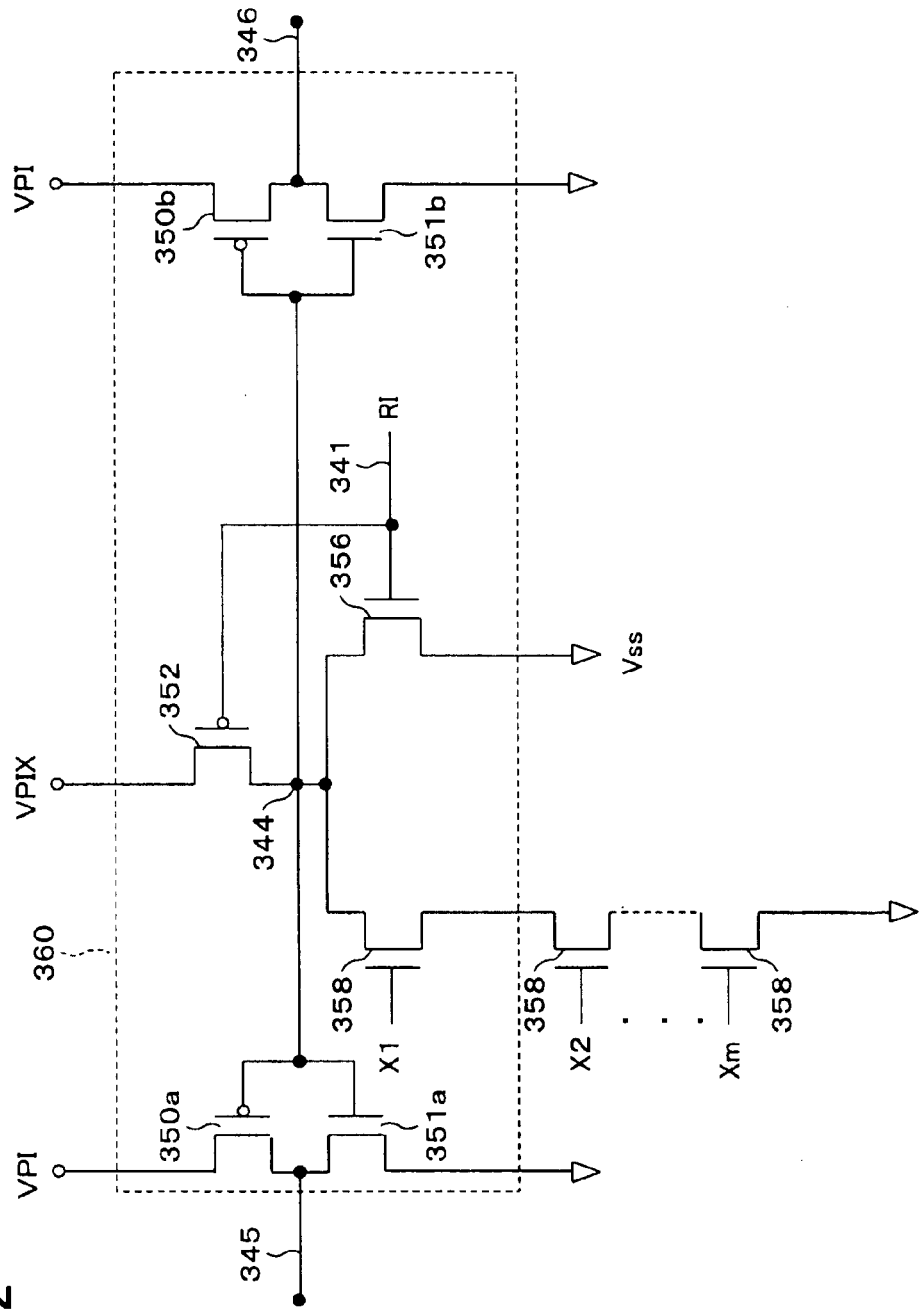
FIG. 22 is a circuit diagram showing an arrangement of a more preferable word line driver circuit.

Note that an NMOS transistor provided outside of the driver circuit shown in FIG. 22 may be shared with the driver circuits for the other rows. Thus, the NMOS transistor is not restricted by the pitches of the memory cells directly.

In designing the semiconductor storage device of the present embodiment, speed of performance of the read programming driver 301 is taken in consideration. Only speed of a reading circuit is taken into consideration generally, because writing and erasing are infrequently performed. The semiconductor storage device is generally used in a reading mode. Thus, it is necessary to carry out the reading at a relatively faster speed. In the following, the present embodiment describes an advantage that a speed of the reading at least as fast as the prior art is concurrently achieved with a higher overall circuit density.

Figure 21:
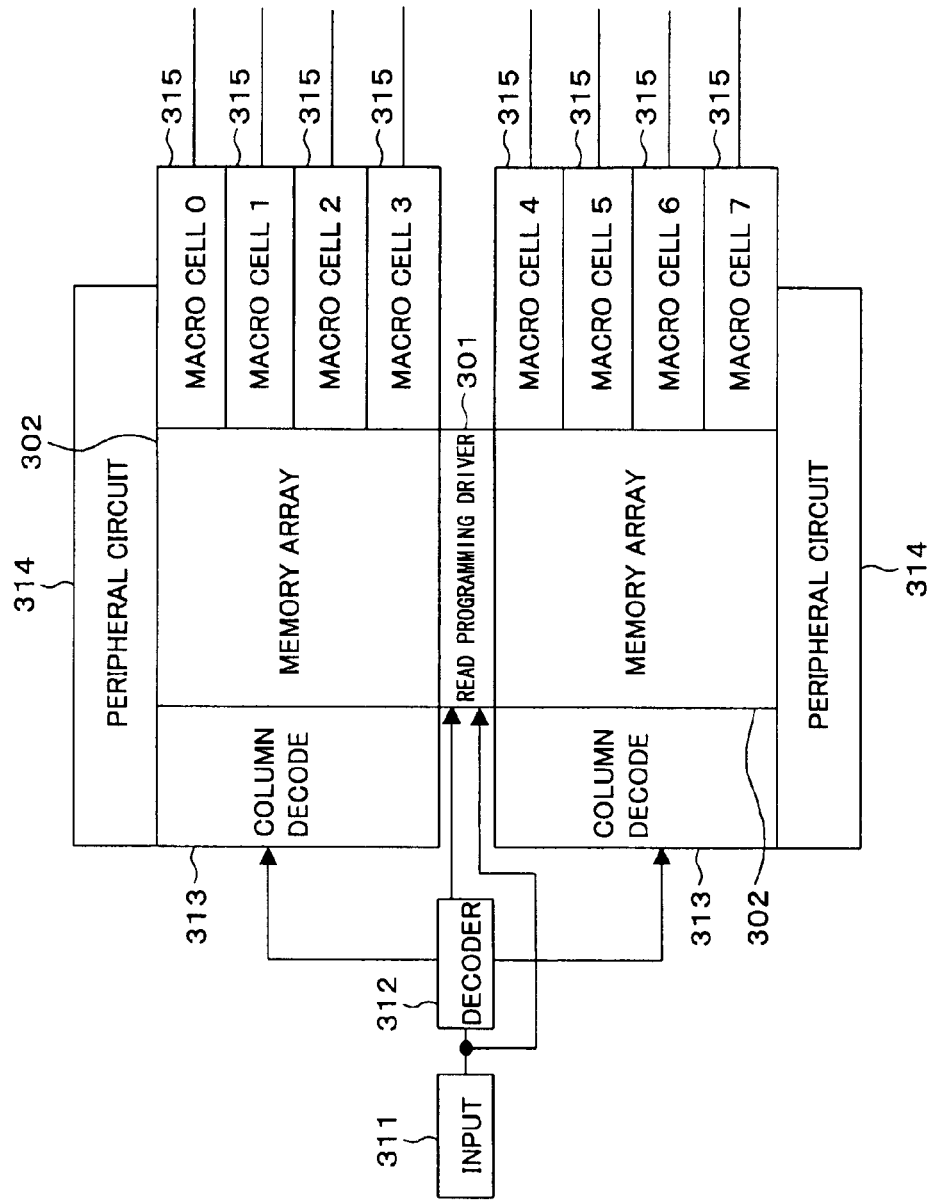
FIG. 21 is a block diagram illustrating, with more details, a device arrangement of a word line driver of the semiconductor storage device of FIG. 20.

FIG. 21 shows a non-volatile memory of the present embodiment with more details.

As shown in FIG. 21, the read programming driver 301 is sandwiched between two memory arrays 302. An address signal is inputted from an input circuit 311 and then supplied to a decoder 312. The input circuit 311 is connected to a reading section of the read programming driver 301.

The decoder 312 generates a row address and a column address in accordance with the signal thus inputted. The decoder 312, which is connected to the read programming driver 301, sends a decoded address to a writing/erasing section of the read programming driver 301. Similarly, the decoder 312 is connected to a column decoder 313 and gives the column decoder 313 the column address. In order to access a cell in the memory array 302 arranged in matrix, the row address selects a row location of the cell and the column address selects a column location of the cell. Output terminals of the memory arrays 302 are connected to macro cells 315.

Note that the present invention may be reduced to practice by using other addressing methods and other decoding methods.

FIG. 22 illustrates the read programming driver 301 in details.

In the read programming driver 301, driver circuits 360 shown in FIG. 22 are respectively provided for rows of the memory array 302. The driver circuits 360 are respectively positioned in the pitch constrained regions and employ the CMOS technology similarly. Each driver 360 is provided with two word lines 345 and 346. The word lines 345 and 346 are each connected to its respective memory arrays 302. Thereby, the word lines 345 and 346 respectively act as output of CMOS invertors. One of the CMOS inverters include transistors 350a and 351a and the other one includes transistors 350b and 351b. The transistors 350a and 350b are p-channel transistors, whereas the transistors 351a and 351b are n-channel transistors. The pair of the transistors 350a and 351a and the pair of the transistors 350b and 351b are connected between VPI and VSS (VSS is a ground in this instance).

A transistor 352 is a p-channel transistor, whereas a transistor 356 is an n-channel transistor. The transistors 352 and 356 are connected in series between the VPIX and VSS thereby forming a CMOS inverter. Drains of the transistors 352 and 356 are connected via a node 344. A plurality of transistors 358, which are n-channel transistors, are connected in series between the node 344 and the ground so that the transistors 358 are in parallel with the transistor 356. Gates of the transistors 358 are each connected to its respective column line to which it belongs. Thereby, conduction in all transistors 358 connected to a specific column occurs when the specific column is addressed (that is, in accordance with a writing/erasing control signal). The occurrence of the conduction in the transistors 358 causes the node 344 to be at a low level (ground level). To the gates of the transistors 352 and 356, a read input signal RI (read control signal) is supplied.

In terms of function, row address lines X1 to Xm are to receive address from the decoder 312 shown in FIG. 21 or from other writing/erasing circuit associated therewith. Moreover, the row address lines X1 to Xm may be extended directly from an address bus.

It is preferable that an input signal Xi is supplied from the decoder 312. Moreover, it is desirable that the pitch constrained region of the device contains therein that portion of the driver circuit 360 which is indicated by dotted line as shown in FIG. 22. The pitch constrained region contains the transistor 358 that is connected to the row address line X1, whereas the other transistors 358, together with the circuits associated therewith, are generally located outside of the pitch constrained region. During the reading operation, at least one of input signals Xi is set to 0. Thereby, a writing/erasing step of the transistors 358 is inactivated during the reading operation. Thus, depending on a state of the input signal RI, one of the transistors 352 and 356 is activated. Accordingly, the transistors 350a and 350b, or the transistors 351a and 351b., are conducted.

Note that the potential VPI and the potential VCC are equal during a reading mode.

In order to write/erase, the read input signal RI is set to low, so as to active the transistor 352. Thereby, the potential VPIX is fixed to the node 344. For writing/erasing a specific row, all transistors 358 belonging to the specific row are turned ON, thereby setting the row address lines X1 to Xm at a high level. This lowers a potential at the node 344.

When the read input signal RI is set to low and the potential at the node 344 is VPIX, all the rows are not selected. That is, the word lines 345 and 346 are low. In order to select a row, all of the row address lines X1 to Xm are set to high. When all of the row address lines X1 to Xm are set to high, both the transistor 352 (PMOS) and the transistor 358 (NMOS) are turned ON. The word lines 345 and 346 associated with the selected row should be high in potential. Therefore, the potential of the node 344 should be reduced to be very close to low. The node 344 is very close to low while the transistors 352 and 358 is turned ON: This indicates that a driving force for the transistor 352 is smaller than a driving force of the transistor 358. Because the driving force for the transistor 352 is smaller than the driving force of the transistor 358, it is possible to activate the transistors 350a and 350b. This is because, by turning ON the transistor 358, the potential at the node 344 gets very closer to the ground potential and the word lines 345 and 346 are caused to have the potential VPI, which is equal to the potential VPP in the writing/erasing mode. Moreover, as shown in FIG. 22, the word line driver circuit in the pitch constrained region is physically small in size.

Here, once a row is selected, the column signal selects a desired memory element from the row thus selected. Further, a sequence of the writing/erasing may be used during a verifying cycle during which the writing and erasing of the memory cell is required. This kind of art to be used during the verifying cycle is well known conventionally.

As described above, the word line driver circuit of the present embodiment is arranged such that the driver circuit for reading and the driver circuit for writing/erasing are combined, the driver circuits controlling the row access of the plurality of memory array. With this arrangement, the circuit associated with the driver circuits and located inside the pitch constrained region of the device is physically small in size.

Moreover, each memory element in the semiconductor storage device includes: a gate electrode; a semiconductor layer; a gate insulating film sandwiched between the gate electrode and the semiconductor layer; a channel region provided under the gate electrode; diffusion regions respectively provided on two sides of the channel region, the diffusion regions being of the other conductivity type than the channel region; and memory functioning members respectively provided on two sides of the gate electrode, the memory functioning members having a function of holding charges therein. Therefore, the formation process of the memory element is very compatible with the formation process of the transistors generally used. Thus, a sense circuit, a periphery circuit (such as an address decoder), or other logic circuits in which the memory element and the generally-used transistor are used, can be easily mounted, on one chip, together with the other logic circuit.

Moreover, each memory element of the present embodiment includes (i) a film having a function of holding charges and having a surface substantially parallel with a surface of the gate insulating film, and (ii) an insulating film separating the film from the channel region or the semiconductor layer and having a film thickness that is thinner than a film thickness of the gate insulating film and is 0.8 nm or thicker. With this arrangement, it becomes easier to inject charges into the memory functioning body, thereby making it possible to write and erase with a lower word line voltage. Therefore, the driver circuit of the present invention can perform the reading operation and the writing/erasing operation with the low word line voltages, which are different with a small difference. Therefore, for combination of the reading driver and the writing/erasing driver, there is no need of designing such that a second to which a high voltage is to be applied is designed with a wider design rule for attaining a higher tolerance against the high voltage, unlike the conventional arts. Therefore, it is possible to attain the combination of the reading driver and the writing/erasing driver with a layout having a smaller pitch. Thus, it is possible to attain smaller circuit area.

[Embodiment 11]

Figure 23:
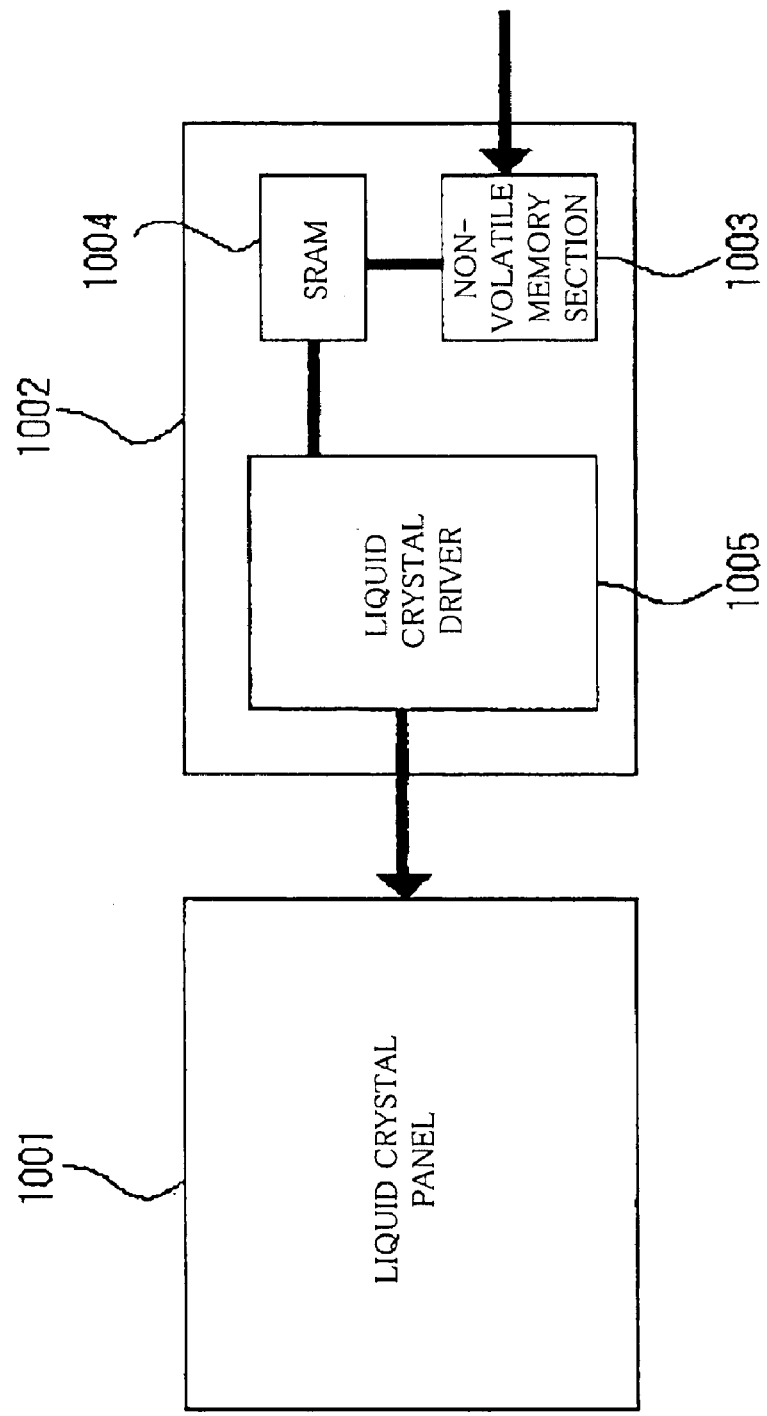
FIG. 23 is a schematic diagram of a liquid crystal display device (Embodiment 11) including a semiconductor storage device of Embodiment 10 of the present invention.

One of application examples of the semiconductor storage device is a non-volatile memory as shown in FIG. 23. The non-volatile memory, which is rewritable, is used for adjusting an image in a liquid crystal panel.

A liquid crystal panel 1001 is driven by a liquid crystal driver 1002. The liquid crystal driver is provided with a non-volatile memory section 1003, an SRAM section 1004, and a liquid crystal driver circuit 1005. The non-volatile memory section 1003 is provided with a memory element of any of Embodiments 1 through 8. It is more preferable that the memory element provided in the non-volatile memory section 1003 is the semiconductor storage device described in Embodiment 10. The non-volatile memory section 1003 can be rewritten by external operation.

Data stored in the non-volatile memory section 1003 is transferred to the SRAM section when the liquid crystal panel 1001 is powered on. The liquid crystal driver circuit 1005 can read out the stored data from the SRAM section when necessary. With the arrangement in which the SRAM section is provided, it is possible to attain a very fast read-out of the stored data.

The liquid crystal driver 1002 may be, as shown in FIG. 23, provided externally of the liquid crystal panel 1001, but may be formed on the liquid panel 1001.

In liquid crystal panels, a gray level to be displayed is changed by applying multi-leveled voltages on each pixel. However, different liquid crystal panels have different relationships between the applied voltage and the gray level to be displayed. Therefore, with an arrangement in which date for compensating unevenness among individual liquid crystal panels is stored in the liquid crystal panels after being produced, it is possible to attain even image quality among the liquid crystal panels by performing compensation based on the data. Therefore, it is preferable that the liquid crystal panel is provided with a rewritable non-volatile memory for storing the data for the compensation. It is preferable to use the memory element of the present embodiment as the non-volatile memory. Especially, it is preferable to use the semiconductor storage device described in Embodiment 10. In the semiconductor storage device described in Embodiment 10, the memory elements of the present embodiment are integrated.

By using the memory element of the present embodiment as the non-volatile memory for adjusting the image in the liquid crystal panel, it is possible to attain low manufacturing cost because it is easy to mount the memory element of the present embodiment, on one chip, together with a circuit such as a liquid crystal driver and the like. Moreover, the semiconductor storage device described in Embodiment 10 is especially suitable for usage in which a relatively small memory capacity is required while high reliability and stability are necessary. In general, the non-volatile memory for adjusting the image in the liquid crystal panel is, for example, several kilo bites and thus has a relatively small memory capacity. Therefore, it is especially preferable to use the semiconductor storage device described in Embodiment 10 as the non-volatile memory for adjusting the image in the liquid crystal panel.

[Embodiment 12]

Figure 24:
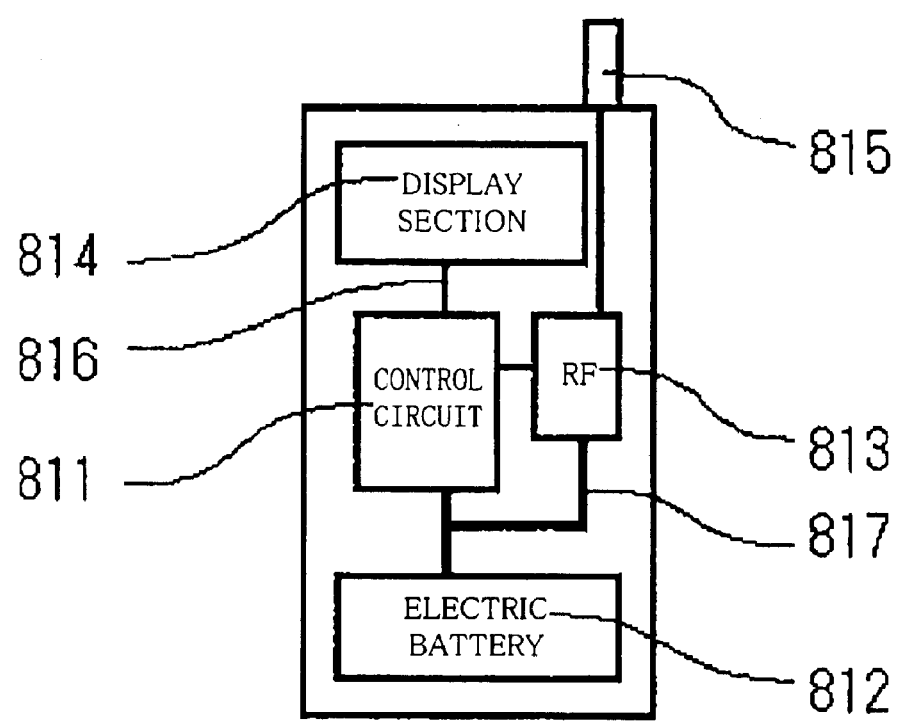
FIG. 24 is a schematic diagram of a portable electronic apparatus (Embodiment 12) including a semiconductor storage device of Embodiment 10 of the present invention.
Figure 25:
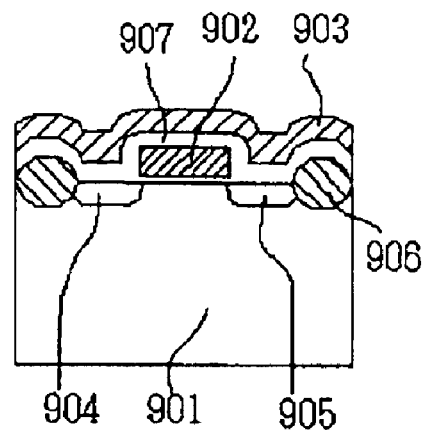
FIG. 25 is a cross-sectional diagram schematically showing a main part of a conventional flash memory.
Figure 26:
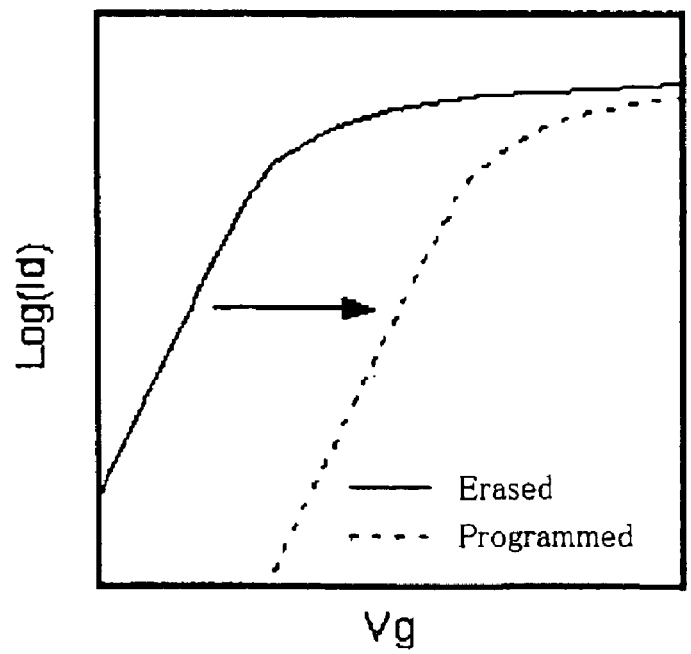
FIG. 26 is a graph showing an electronic property of a conventional flash memory.

FIG. 24 shows a portable telephone, which is a portable electronic apparatus in which the semiconductor storage device described in Embodiment 10 is included.

The portable telephone is mainly provided with a control circuit 811, an electric battery 812, an RF (Radio Frequency) circuit 813, a display section 814, an antenna 815, a signal line 816, a power line 817, and the like. The control circuit 811 is provided with the semiconductor storage device described in Embodiment 10. It is preferable that the control circuit 811 is an integrated circuit which has the arrangement as described in Embodiment 10, and which functions as both a memory circuit element and a logic circuit element. With this arrangement, it becomes easier to produce the integrated circuit and reduce a production cost of the portable electronic apparatus, especially.

As described above, it is possible to attain faster operation speed and lower production cost of the portable electronic apparatus by using the semiconductor storage device in the portable electronic apparatus, the semiconductor storage device being advantageous in allowing easy process of mounting together a logic circuit section and a memory section and in attaining a high-speed read-out. Therefore, it is possible to attain a portable electronic apparatus having a low cost, a high reliability and high performance.

Moreover, for the portable electronic apparatus, process of mounting a memory section and a logic circuit section is easy because the portable electronic apparatus is provided with the semiconductor storage device. As a result, it is possible to attain faster performance speed of the electronic apparatus, and reduce a manufacturing cost of the electronic apparatus. Further, it is possible to attain a display device having a low cost and a high reliability.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A driver circuit for a semiconductor storage device, the driver circuit driving a memory array which includes a plurality of memory elements, wherein:

each memory element includes:
    a gate electrode;
    a semiconductor layer;

a gate insulating film sandwiched between the gate electrode and the semiconductor layer;

a channel region provided under the gate electrode;

diffusion regions respectively provided on two sides of the channel region, the diffusion regions being of the other conductivity type than the channel region; and memory functioning members respectively provided on two sides of the gate electrode, the memory functioning members having a function of holding charges therein, and the driver circuit includes:

an output driver, connected to a node, for driving a word line of the memory array, wherein the node is set to a potential for controlling operation of the driver circuit;

a first transistor connected between the node and a power source, and a second transistor connected between the node and a wire returned to the power source, one of the first transistor and the second transistor being activated, during reading operation, in accordance with a read control signal supplied to its gate;

a plurality of writing/erasing transistors connected in series between the node and the wire returned to the power source, the plurality of writing/erasing transistors being activated in accordance with a writing/erasing control signal, the first transistor being activated during writing/erasing period so as to operate together with the writing/erasing transistors, in order to control output supplied from the output driver.

2. The driver circuit as set forth in claim 1, wherein:

the output driver includes a pair of first CMOS inverter transistors.

3. The driver circuit as set forth in claim 2, further comprising:

a pair of second CMOS inverter transistors, connected to the node.

4. The driver circuit as set forth in claim 3, wherein:

the first transistors and the second transistors form the pair of second CMOS inverter transistors, gates of the first transistors and the second transistors receiving the read control signal respectively.

5. The driver circuit as set forth in claim 4, wherein:

each writing/erasing transistor is respectively provided for one line provided in a pitch constrained region in the memory array.

6. The driver circuit as set forth in claim 1, wherein:

each memory element includes (i) a film having a function of holding charges and having a surface substantially parallel with a surface of the gate insulating film, and (ii) an insulating film separating the film from the channel region or the semiconductor layer and having a film thickness that is thinner than a film thickness of the gate insulating film and is 0.8 nm or thicker.

7. A portable electronic apparatus comprising:

the memory array; and the driver circuit as set forth in claim 1, for a semiconductor storage device.

8. A portable electronic apparatus comprising:

the memory array; and the driver circuit as set forth in claim 2, for a semiconductor storage device.

9. A portable electronic apparatus comprising:

the memory array; and the driver circuit as set forth in claim 3, for a semiconductor storage device.

10. A portable electronic apparatus comprising:

the memory array; and the driver circuit as set forth in claim 4, for a semiconductor storage device.

11. A portable electronic apparatus comprising:

the memory array; and the driver circuit as set forth in claim 5, for a semiconductor storage device.

12. A portable electronic apparatus comprising:

the memory array; and the driver circuit as set forth in claim 6, for a semiconductor storage device.

* * * * *